United States Patent
Sung et al.

(10) Patent No.: US 10,784,360 B2
(45) Date of Patent: Sep. 22, 2020

(54) TRANSISTOR GATE TRENCH ENGINEERING TO DECREASE CAPACITANCE AND RESISTANCE

(71) Applicant: INTEL CORPORATION, Santa Clara, CA (US)

(72) Inventors: Seung Hoon Sung, Portland, OR (US); Willy Rachmady, Beaverton, OR (US); Jack T. Kavalieros, Portland, OR (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/080,824

(22) PCT Filed: Apr. 1, 2016

(86) PCT No.: PCT/US2016/025597
§ 371 (c)(1),
(2) Date: Aug. 29, 2018

(87) PCT Pub. No.: WO2017/171843
PCT Pub. Date: Oct. 5, 2017

(65) Prior Publication Data
US 2019/0088759 A1    Mar. 21, 2019

(51) Int. Cl.
*H01L 29/423* (2006.01)
*H01L 29/49* (2006.01)
(Continued)

(52) U.S. Cl.
CPC .... *H01L 29/4983* (2013.01); *H01L 21/28114* (2013.01); *H01L 29/42368* (2013.01);
(Continued)

(58) Field of Classification Search
None
See application file for complete search history.

(56) References Cited

U.S. PATENT DOCUMENTS

| 9,287,403 B1 | 3/2016 | Lee et al. |
| 2013/0049142 A1 | 2/2013 | Liu et al. |

(Continued)

FOREIGN PATENT DOCUMENTS

| JP | 2009/200211 A | 9/2009 |
| WO | 2017/171843 | 10/2017 |

OTHER PUBLICATIONS

International Search Report and Written Opinion received for PCT Application No. PCT/US2016/025597, dated Dec. 8, 2016. 16 pages.

(Continued)

*Primary Examiner* — Grant S Withers
(74) *Attorney, Agent, or Firm* — Finch & Maloney PLLC

(57) ABSTRACT

Techniques are disclosed for transistor gate trench engineering to decrease capacitance and resistance. Sidewall spacers, sometimes referred to as gate spacers, or more generally, spacers, may be formed on either side of a transistor gate to help lower the gate-source/drain capacitance. Such spacers can define a gate trench after dummy gate materials are removed from between the spacers to form the gate trench region during a replacement gate process, for example. In some cases, to reduce resistance inside the gate trench region, techniques can be performed to form a multilayer gate or gate electrode, where the multilayer gate includes a first metal and a second metal above the first metal, where the second metal includes lower electrical resistivity properties than the first metal. In some cases, to reduce capacitance inside a transistor gate trench, techniques can be performed to form low-k dielectric material on the gate trench sidewalls.

20 Claims, 10 Drawing Sheets

(51) Int. Cl.
  *H01L 29/78*   (2006.01)
  *H01L 29/66*   (2006.01)
  *H01L 21/28*   (2006.01)
  *H01L 29/775*  (2006.01)

(52) U.S. Cl.
  CPC .. *H01L 29/42376* (2013.01); *H01L 29/66545* (2013.01); *H01L 29/66553* (2013.01); *H01L 29/66606* (2013.01); *H01L 29/78* (2013.01); H01L 29/42392 (2013.01); H01L 29/775 (2013.01); H01L 29/785 (2013.01); H01L 29/7856 (2013.01)

(56) References Cited

U.S. PATENT DOCUMENTS

| | | | |
|---|---|---|---|
| 2014/0203333 A1* | 7/2014 | Huang | H01L 29/4966 257/288 |
| 2014/0295659 A1 | 10/2014 | Lim et al. | |
| 2014/0299939 A1* | 10/2014 | Kim | H01L 21/02697 257/369 |
| 2015/0221644 A1* | 8/2015 | Baek | H01L 27/0886 257/401 |
| 2015/0311208 A1 | 10/2015 | Kim | |
| 2016/0284699 A1* | 9/2016 | Jeong | H01L 27/0886 |

OTHER PUBLICATIONS

International Preliminary Report on Patentability received for PCT Application No. PCT/US2016/025597, dated Oct. 11, 2018. 13 pages.

* cited by examiner

TRANSISTOR GATE TRENCH ENGINEERING TO DECREASE CAPACITANCE AND RESISTANCE

BACKGROUND

Semiconductor devices are electronic components that exploit the electronic properties of semiconductor materials, such as silicon (Si), germanium (Ge), silicon germanium (SiGe), germanium tin (GeSn), gallium arsenide (GaAs), and indium gallium arsenide (InGaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include sidewall spacers (or so-called gate spacers) on either side of the gate that can help determine the channel length and can help with replacement gate processes, for example. Complementary MOS (CMOS) structures typically use a combination of p-type MOSFETs (p-MOS) and n-type MOSFETs (n-MOS) to implement logic gates and other digital circuits.

A finFET is a transistor built around a thin strip of semiconductor material (generally referred to as a fin). The transistor includes the standard FET nodes, including a gate, a gate dielectric, a source region, and a drain region. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. Tri-gate transistors are one example of non-planar transistor configurations, and other types of non-planar configurations are also available, such as so-called double-gate transistor configurations, in which the conductive channel principally resides only along the two sidewalls of the fin (and not along the top of the fin). Another non-planar transistor configuration is a gate-all-around configuration, which is configured similarly to a fin-based transistor, but instead of a finned channel region where the gate is on three portions (and thus, there are three effective gates), one or more nanowires (or nanoribbons) are used and the gate material generally surrounds each nanowire.

Figure 1A:
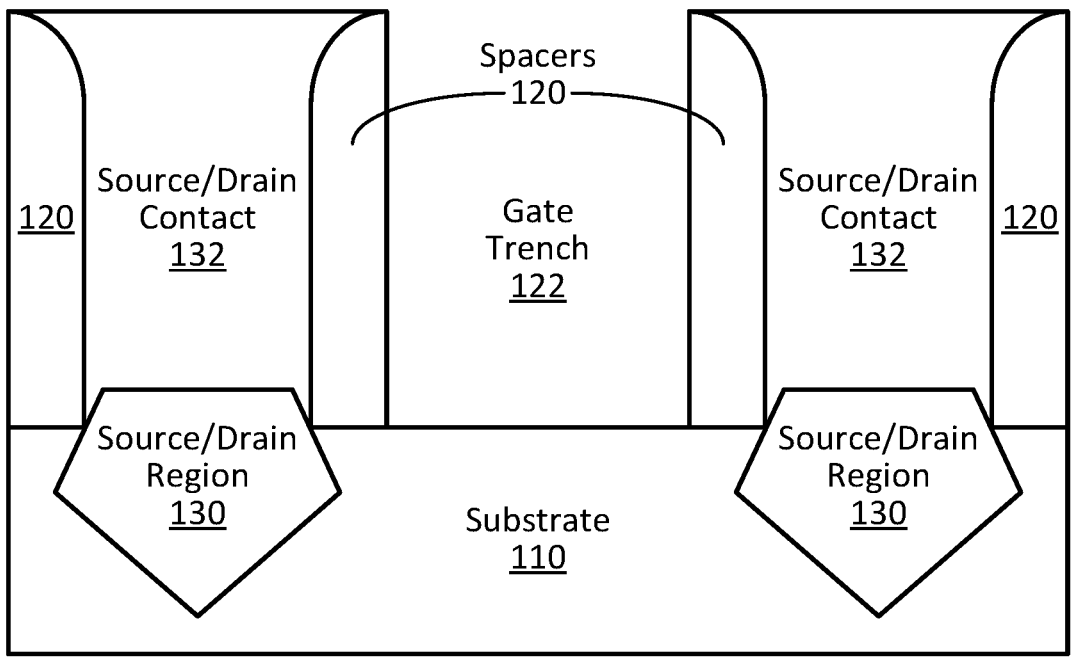
FIGS. 1A-F illustrate example integrated circuit structures resulting from a method configured to form a transistor including gate trench engineering to decrease resistance, in accordance with some embodiments of this disclosure. Note that the illustrations provided in FIGS. 1A-F are along the orthogonal-to-gate direction, illustrating cross-sectional views that may be achieved, for example, using electron microscopy.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Numerous non-trivial challenges are present in fabricating semiconductor transistors, particularly as the industry attempts to keep up with Moore's law. For example, resistance and capacitance issues inside a transistor gate trench present challenges, particularly as gate trench scaling continues. Such gate trench resistance and capacitance related challenges can negatively affect transistor performance. As will be appreciated in light of this disclosure, gate trench engineering can be used to resolve such challenges to maintain the high performance of transistor devices, such as for CMOS devices, especially as transistor devices (and features thereof) continue to decrease in size.

Thus, techniques are provided herein for transistor gate trench engineering to decrease capacitance and resistance. Sidewall spacers, sometimes referred to as gate spacers, or more generally, spacers, may be formed on either side of a transistor gate to help eliminate or lower the leakage current of gate-source and gate-drain. Such spacers can also be used to define a gate trench after dummy gate materials are removed from between the spacers to form the gate trench region. In some embodiments of the present disclosure, to reduce resistance inside the gate trench region, techniques provided herein can be performed to form a multilayer gate or gate electrode between the spacers. The multilayer gate includes a first metal and a second metal above the first metal, where the second metal includes lower electrical resistivity properties than the first metal. In some embodiments, to reduce capacitance inside a transistor gate trench, techniques provided herein can be performed to form low-k dielectric material on the gate trench sidewalls between the spacers. In some embodiments, to reduce both resistance and capacitance inside a transistor gate trench between the spacers, techniques provided herein can be performed to both form a multilayer gate that includes a first metal and a second metal including lower electrical resistivity than the first metal and also form low-k dielectric material on the gate trench sidewalls. In some embodiments, the techniques may be achieved using one or more directional etch processes to partially remove material at the gate trench location, as will be apparent in light of this disclosure. In some such embodiments, the directional etch process may result in slanted or sloped material interface profiles, as will be described in more detail herein. Further, in some embodiments, the directional etch process may enable the removal of gate metal material having relatively higher electrical resistivity from the sidewalls of the gate trench region, thus enabling that previously occupied area to be replaced by a gate metal material having a relatively lower electrical resistivity, and thereby lowering the overall resistance at the gate trench location.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit or transistor device having a gate structure configured as described herein. For example, in some embodiments, such structures may include a multilayer gate that includes a first gate metal and a second gate metal above the first gate metal, the second gate metal having a lower electrical resistivity than the first gate metal. In some such embodiments, the difference in electrical resistivity between the two metals may be, for example, at least 2, 5, 10, 15, 20, 25, 30, 35, 40, 50, 60, 70, 80, 90, or 100 nΩ·m (at 20° C.), or some other suitable threshold difference, as will be appreciated in light of this disclosure. In some embodiments, one or more of the material features formed in the gate trench region may have profile modifications as a result of directional etch processes used, as previously described. In some such embodiments, the interface profile modifications are present at interfaces between different material features and can be detected in a transistor structure employing such imaging/analysis techniques, as will be described in more detail herein. In some embodiments, the various gate structures provided herein may be detected, for instance, by measuring the benefits achieved, such as the improvements in resistance and/or capacitance in the gate trench region and/or the improvements in transistor performance derived as a result of the decrease in resistance and/or capacitance in the gate trench region. Numerous configurations and variations will be apparent in light of this disclosure.

Architecture and Methodology

FIGS. 1A-F illustrate example integrated circuit structures resulting from a method configured to form a transistor including gate trench engineering to decrease resistance, in accordance with some embodiments of this disclosure. FIGS. 2A-D illustrate example integrated circuit structures resulting from a method configured to form a transistor including gate trench engineering to decrease capacitance, in accordance with some embodiments of this disclosure. FIGS. 3A-D illustrate example integrated circuit structures resulting from a method configured to form a transistor including gate trench engineering to decrease resistance and capacitance, in accordance with some embodiments of this disclosure. The illustrations provided in FIGS. 1A-F, 2A-D, and 3A-D are along the orthogonal-to-gate direction, illustrating cross-sectional views that may be achieved, for example, using SEM or TEM. Note that although the integrated circuit structures are primarily depicted in the context of forming a transistor having a planar configuration, the present disclosure is not intended to be so limited. For example, in some embodiments, the techniques described herein may be used to form a transistor having a non-planar configuration, such as a finned configuration (e.g., finFET), dual-gate configuration, tri-gate configuration, and/or gate-all-around configuration (e.g., including one or more nanowires or nanoribbons), as will be described in more detail with reference to FIG. 6. Further, in some embodiments, the techniques can be used to form p-type and/or n-type transistor devices, such as p-type MOSFET (p-MOS), n-type MOSFET (n-MOS), p-type tunnel FET (p-TFET), or n-type TFET (n-TFET), to name a few examples. Further yet, in some embodiments, the techniques may be used to benefit either or both of p-type and n-type transistors included in complementary MOS (CMOS) or complementary TFET (CTFET) devices, for example. Further still, in some embodiments, the techniques may be used with devices of varying scales, such as transistor devices having critical dimensions in the micrometer range or in the nanometer range (e.g., transistors formed at the 32, 22, 14, 10, 7, or 5 nm process nodes, or beyond).

FIG. 1A illustrates an example integrated circuit structure after source/drain processing has been performed and after the gate region has been opened to form the example resulting structure shown, in accordance with an embodiment. As shown, the example structure includes substrate 110, source/drain regions 130 located in and above substrate 110, source/drain contacts 132 located on the source/drain regions 130, and spacers 120 between source/drain contacts 132 and gate trench 122 (in other words, adjacent to the source/drain contacts 132 and also adjacent to the gate trench 122). As can be understood based on FIG. 1A, in some embodiments, the structure may have included a dummy gate stack prior to removal of the same to form gate trench 122 in the structure shown. In some such embodiments, formation of the dummy gate stack may have included dummy gate oxide/dielectric deposition, dummy gate electrode (e.g., poly-Si) deposition, and patterning hardmask deposition, for example. Such deposition processes may include any suitable deposition techniques, such as chemical vapor deposition (CVD), atomic layer deposition (ALD), physical vapor deposition (PVD), and/or any other suitable process, depending on the dummy gate being formed. Additional processing may include patterning the dummy gate material to form the shape of the gate trench 122 shown, for example. As can also be understood based on this disclosure, the dummy gate was used as a sacrificial structure, which may have allowed for the formation of other components, such as spacers 120. In addition, the dummy gate material (and more specifically, the dummy gate oxide/ dielectric) may have protected the region targeted to be a transistor channel region (e.g., the surface under gate trench 122) during processing, such as during the source/drain region processing. In some cases, gate trench region 122 may be considered the region between spacers 120, for example. Note that the techniques are illustrated using the example structures of FIGS. 1A-F, 2A-D, and 3A-D in a gate last process flow, such that the dummy gate stack is removed to form gate trench 122 (and to allow the formation of a gate stack as described herein) after source/drain processing has been performed, for instance, for ease of description. However, in some embodiments, the techniques described herein may be performed in a gate first process flow, such that source/drain processing is performed after the gate stacks described herein are formed, for instance, or at any other suitable stage of the transistor fabrication process flow. In any such embodiments, the resulting transistor structures (e.g., shown in FIGS. 1F, 2D, and 3D) would be the same or similar.

In some embodiments, substrate 110 may include: a bulk substrate including a group IV material, such as silicon (Si), germanium (Ge), SiGe, germanium tin (GeSn), or silicon carbide (SiC), and/or at least one group III-V material and/or group II-VI material and/or sapphire and/or any other suitable material(s) depending on the end use or target application; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or group II-VI and/or sapphire). Note that group IV material as used herein includes at least one group IV element (e.g., carbon, silicon, germanium, tin, lead), such as Si, Ge, SiGe, GeSn, or SiC to name some examples. Note that group II-VI material as used herein includes at least one group II element (e.g., zinc, cadmium, mercury) and at least one group VI element (e.g., oxygen, sulfur, selenium, tellurium, polonium), such as zinc oxide (ZnO), zinc sulfide (ZnS), cadmium selenide (CdSe), cadmium zinc telluride (CdZnTe), mercury cadmium telluride (HgCdTe), to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Although substrate 110, in this example embodiment, is shown as having a thickness (dimension in the vertical direction) similar to the other features for ease of illustration, in some instances, substrate 110 may be much thicker than the other features, such as having a thickness in the range of 50 to 950 microns, for example. In some embodiments, substrate 110 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

In some embodiments, spacers 120 may be formed using a dummy gate stack, as previously described. The material of spacers 120, in some embodiments, may include any suitable materials, such as insulator materials, dielectric materials, oxides (e.g., a silicon oxide material), and/or nitrides (e.g., a silicon nitride material). In some embodiments, gate trench 122 may be formed by removing a dummy gate stack, as previously described, using, for example, one or more wet and/or dry etch processes. In some embodiments, the shape and/or size of the dummy gate stack and/or spacers 120 may be formed to obtain a desired gate stack size and/or shape, for example. Note that the spacers 120 are shown in the example structure of FIG. 1A as having a width (dimension in the horizontal direction) that is narrower than the widths of adjacent gate trench 122 and source/drain contacts 132; however, the present disclosure is not intended to be so limited. Also note that spacers 120 are shown on the outside of the structure illustrated, and such spacers 120 may be used to electrically isolate the transistor device being formed from neighboring devices (which may be simultaneously formed) on the same chip or substrate 110, for example.

As can be seen in this example embodiment, source/drain regions 130 may have been formed by etching out a portion of substrate 110 and depositing (or growing or regrowing) the source/drain region material 130, using, for example an epitaxial deposition process such as CVD, metal-organic chemical vapor deposition (MOCVD), or molecular-beam epitaxy (MBE), to name a few example processes. In some embodiments, the source/drain may be completely in the substrate, native to the substrate material (e.g., including doping), over the substrate, or any combination thereof, depending on the end use or target application. In some embodiments, source/drain regions 130 may include any suitable materials and suitable dopants, depending on the end use or target application. For example, in an embodiment where substrate 110 includes silicon and the transistor device is to be a p-type MOSFET, source/drain regions 130 may both include p-type doped silicon (e.g., where boron is the p-type dopant), and such material may or may not be native to the substrate material. In another example embodiment, where substrate 110 includes silicon and the transistor device is to be an n-type MOSFET, source/drain regions may both include n-type doped silicon (e.g., where phosphorus is the n-type dopant), and such material may or may not be native to the substrate material. In some embodiments, any suitable source/drain 130 material and optional doping schemes may be used, depending on the end use or target application. For example, in TFET configurations, the source and drain regions 130 may be oppositely type doped (e.g., source is p-type doped and drain is n-type doped), with the channel region being minimally doped or undoped (e.g., intrinsic or i-type semiconductor material).

In some embodiments, the source/drain region 130 material may be native to substrate 110 and may or may not include doping (e.g., via implantation), or the source/drain region 130 material may be formed using replacement material, which may or may not include removing a portion of the substrate to form source/drain trenches for deposition/growth of the replacement source/drain regions 130. In some embodiments, source/drain regions 130 may include a multi-layer structure of two or more material layers. In some embodiments, source/drain regions 130 may include grading (e.g., increasing and/or decreasing) the content of one or more materials in at least a portion of the regions 130. For instance, in some embodiments, a passivation material may be deposited prior to the deposition of the primary source/drain material to assist with the quality of the interface between the source/drain material and the substrate material, for example, depending on the end use or target application. Further, in some embodiments, a contact-improving material may be formed on the top of the source/drain region material to assist with making contact to source/drain contacts 132, for example, depending on the end use or target application. In some embodiments, the source/drain epitaxial regions may be grown after performing an etch-under-cut (EUC) process. In some such embodiments, the source/drain regions may extend under spacers 120 and may even extend under the gate region (e.g., under gate trench 122 in FIG. 1A), and such extended portions may be referred to as source/drain tips or extensions, for example. For example, in the structure shown in the embodiment of FIG. 1A, the source/drain regions partially extend under spacers 120 (e.g., they extend about halfway under the spacers 120). The techniques described herein are not intended to be limited to any specific source/drain configuration.

In some embodiments, source/drain contacts 132 may be formed using any suitable techniques, such as using any suitable deposition processes (e.g., CVD, ALD, or PVD). In some embodiments, source/drain contacts 132 may include any suitable material, such as a conductive metal or alloy (e.g., aluminum, tungsten, silver, nickel-platinum, or nickel-aluminum). In some embodiments, source/drain contacts 132 may include a resistance reducing metal and a contact plug metal, or just a contact plug, depending on the end use or target application. Example contact resistance reducing metals include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the source/drain contact regions 132, such as adhesion layers (e.g., titanium nitride) and/or liner or barrier layers (e.g., tantalum nitride), if so desired. In some embodiments, metallization of the source/drain contacts 132 may be carried out, for example, using an alloying, silicidation, or germanidation process (e.g., generally, deposition of contact metal followed by annealing). In some embodiments, hardmask and/or dielectric material, or other suitable material, may be located on and over source/drain contact material 132 to protect source/drain contact regions 132 during subsequent processing, for example. In some such embodiments, the hardmask and/or dielectric material on and above source/drain contact material 132 may help ensure that the top surface of the contact regions stays undamaged by the gate trench processing described herein, for example.

Figure 1B:
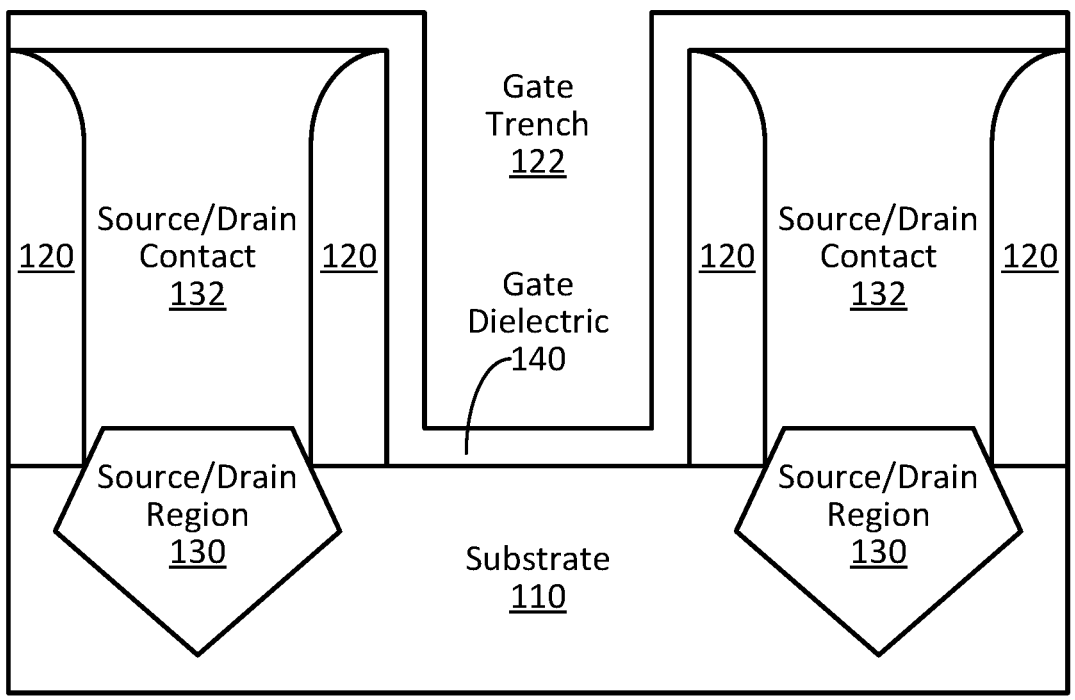

FIG. 1B illustrates an example structure after gate dielectric material 140 has been deposited on the structure of FIG. 1A, in accordance with an embodiment. In some embodiments, gate dielectric material 140 may be formed using any suitable techniques, such as using any suitable deposition processes (e.g., CVD, ALD, or PVD). As can be seen in this example embodiment, the deposition of gate dielectric material 140 resulted in a conformal layer over the structure of FIG. 1A, such that the material tracks with the topography of the structure (including the sidewalls of gate trench 122). However, in some embodiments, the material may be deposited in another manner, such as only in the gate trench location, for example. Further note that in some embodiments, deposition of the gate dielectric material 140 may have filled or substantially filled gate trench 122 and the structure of FIG. 1B may have been formed after performing an etch process to re-form gate trench 122. In some embodiments, gate dielectric material 140 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, aluminum nitride, lead scandium tantalum oxide, and lead zinc niobate. In some embodiments, an annealing process may be carried out on the gate dielectric layer 140 to improve its quality when a high-k material is used, for example. In some embodiments, gate dielectric layer 140 may include a multi-layer structure of two or more material layers. In some embodiments, gate dielectric layer 140 may include grading (e.g., increasing and/or decreasing) the content of one or more materials in at least a portion of the gate dielectric layer 140.

Figure 1C:
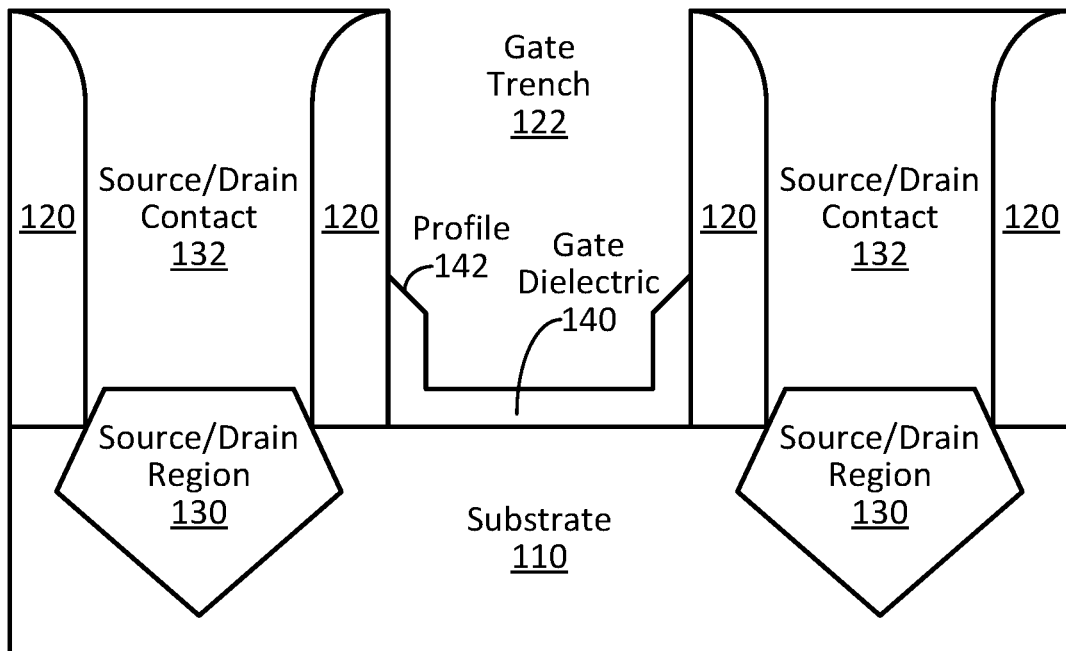

FIG. 1C illustrates an example structure after some of the gate dielectric material 140 of the structure of FIG. 1B has been removed, in accordance with an embodiment. In some embodiments, any suitable wet and/or dry etch techniques may be used to partially remove the gate dielectric material 140 as shown in the resulting structure of FIG. 1C. For example, in some such embodiments, one or more suitable directional etch process may be used to form the gate dielectric 140 structure shown, where the remaining portions of gate dielectric material 140 on the gate trench 122 sidewalls include a profile 142 that will be described in more detail with reference to FIGS. 5A-D. In embodiments where a directional etch process is used, the process may include an anisotropic wet etch technique including a suitable etchant. In some such embodiments, the etchant may selectively remove gate dielectric material 140 at a rate of at least 2, 3, 4, 5, 10, 15, 20, 25, or 50 times faster, or some other suitable minimum threshold amount, than exposed material on the integrated circuit structure located elsewhere, for example.

Figure 1D:
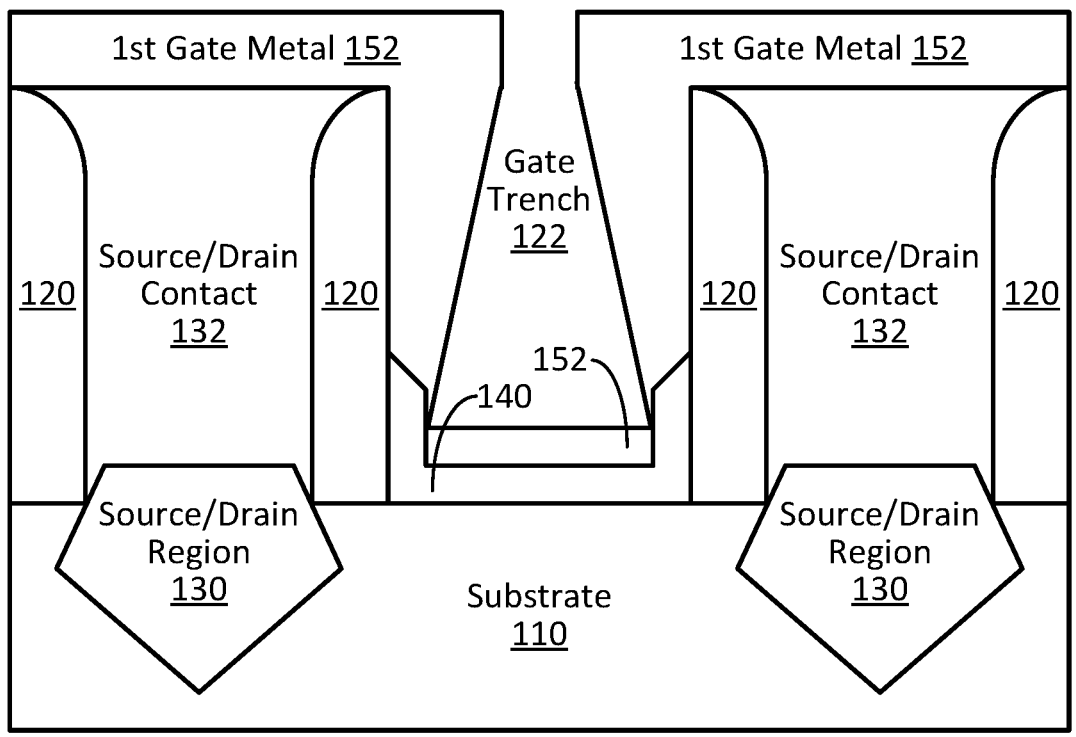
Figure 1E:
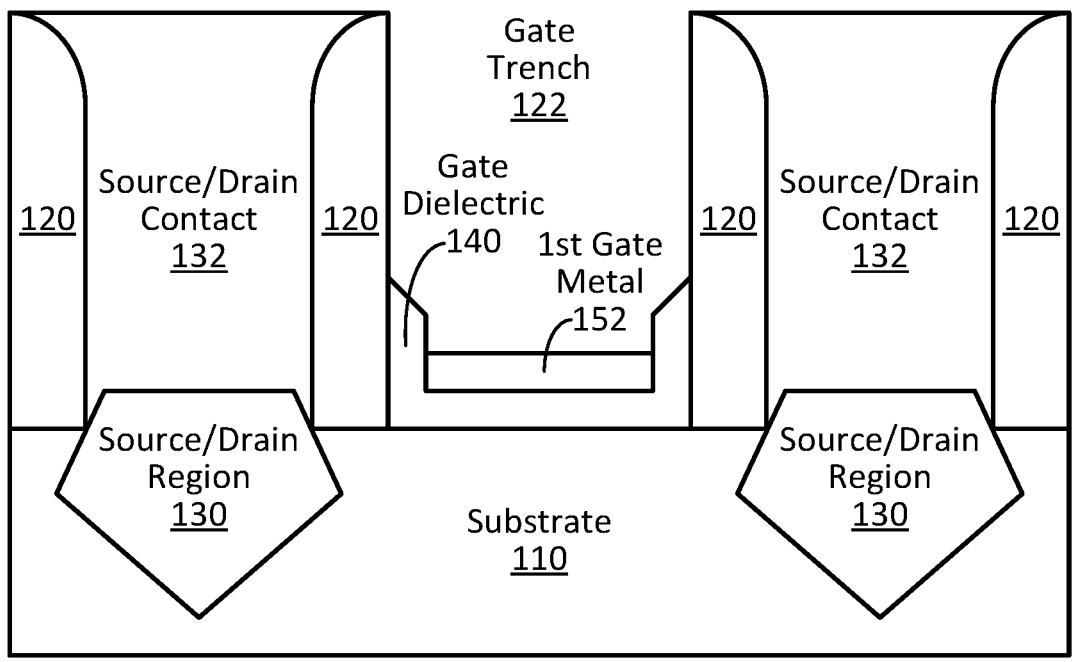
Figure 1F:
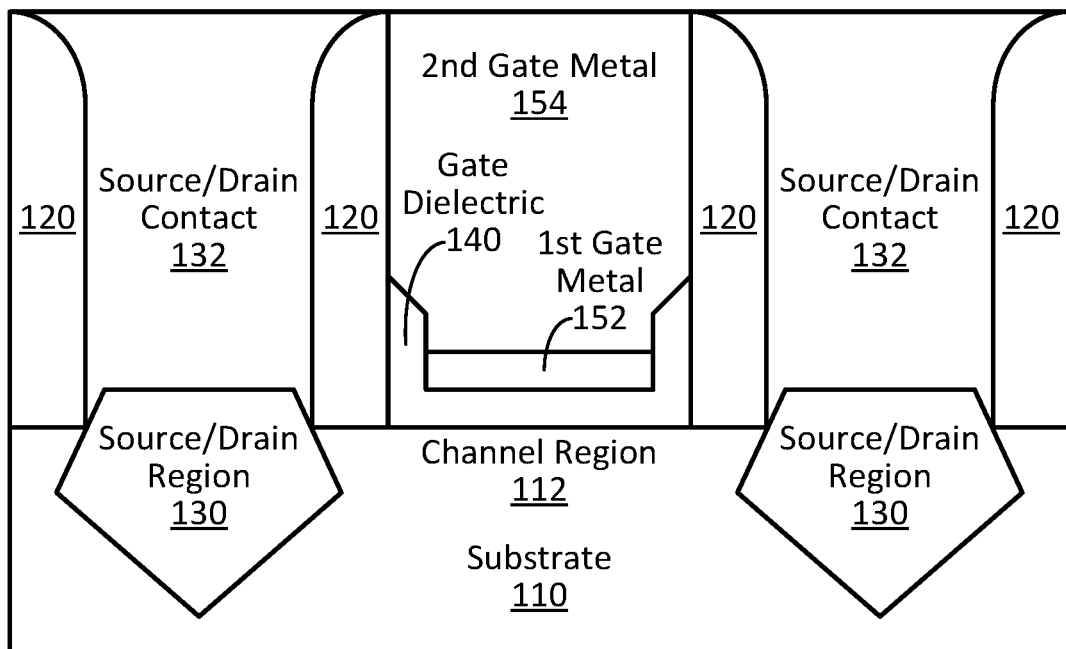

FIG. 1D illustrates an example structure after first gate metal material 152 has been deposited on the structure of FIG. 1C, in accordance with an embodiment. In some embodiments, first gate metal material 152 may be formed using any suitable techniques, such as using any suitable deposition process (e.g., CVD, ALD, or PVD). FIG. 1E illustrates an example structure after some of the first gate metal material 152 of the structure of FIG. 1D has been removed, in accordance with an embodiment. In some embodiments, any suitable wet and/or dry etch techniques may be used to partially remove the first gate metal material 152 as shown in the resulting structure of FIG. 1E. For example, in some such embodiments, one or more suitable directional etch processes may be used to form the first gate metal 152 structure shown, where the remaining portions of first gate metal material 152 are on and between portions of gate dielectric layer 140, as shown. In embodiments where a directional etch process is used, the process may include an anisotropic wet etch technique including a suitable etchant. In some such embodiments, the etchant may selectively remove first gate metal material 152 at a rate of at least 2, 3, 4, 5, 10, 15, 20, 25, or 50 times faster, or some other suitable minimum threshold amount, than exposed material on the integrated circuit structure located elsewhere, for example. FIG. 1F illustrates an example structure after second gate metal material 154 has been formed in the remainder of gate trench 122 of the structure of FIG. 1E, in accordance with an embodiment. In some embodiments, second gate metal material 154 may be formed using any suitable techniques, such as using any suitable deposition process (e.g., CVD, ALD, or PVD). As can be seen in FIG. 1F, the second gate metal material 154 fills the remainder of gate trench 122 from the structure of FIG. 1E, in this example embodiment. In some embodiments, planarization and/or polish processes may be used in combination with the techniques described herein, such as after depositing second gate metal material 154 to form the structure of FIG. 1F, for example. In this example embodiment, as a result of the etch performed to remove first gate material 152 from the gate trench 122 sidewalls (which can be seen by comparing FIGS. 1D and 1E), the second metal gate material 154 occupies more area in the gate trench region 122. For example, if the second metal gate material had been deposited on the structure of FIG. 1D (possibly after a planarization process was used to remove the first gate metal material 152 from on top of the S/D contacts 132), then the first metal gate material 152 would still be on the sidewalls of the gate trench region and would be located between the second gate material 154 and adjacent spacers 120. Further, the first metal gate material 152 would have occupied more gate trench area (and substantially more gate trench area, at that) than shown in the structure of FIG. 1F, for example. However, as a result of the etch performed to form the structure of FIG. 1E, the first gate metal material 152 is not on the gate trench region 122 sidewalls and is not located between the second gate metal material 154 and the adjacent spacers 120, as can be seen in FIG. 1F.

In some embodiments, first gate metal material 152 may include any suitable metal and/or metal alloy material, such as a titanium (Ti), aluminum (Al), nickel (Ni), and/or platinum (Pt) based compound, to name some examples. Other example materials for first gate metal material 152 may include tungsten (W), tantalum (Ta), titanium nitride (TiN), or tantalum nitride (TaN), just to name some examples. In some embodiments, second gate metal material 154 may include any suitable metal or metal alloy material, such as cobalt (Co), copper (Cu), gold (Au), silver (Ag), tungsten (W), or aluminum (Al), to name some examples. In some embodiments, either or both of the metal gate layers 152, 154 may include a multi-layer structure of two or more material layers. In some embodiments, either or both of the metal gate layers 152, 154 may include grading (e.g., increasing and/or decreasing) the content of one or more materials in at least a portion of the layer(s). In some embodiments, the gate stack may include layers in addition to those included in the example structure of FIG. 1F (which are gate dielectric layer 140, first metal gate layer 152, and second metal gate layer 154). For instance, in some such embodiments, one or more work-function material layers may be included in the gate stack to increase the interface quality between layers 140 and 152 and/or layers 152 and 154, for example. Further, such work-function material layers may be present to improve the electrical properties in the gate stack.

In some embodiments, first gate material 152 may have an electrical resistivity of greater than 20, 25, 30, 35, 40, 45, 50, 60, 70, 80, 90, or 100 nΩ·m (at 20° C.), or some other suitable minimum threshold value, as will be appreciated in light of this disclosure. In some embodiments second gate metal material 154 may have an electrical resistivity of less than 50, 45, 40, 35, 30, 25, or 20 nΩ·m (at 20° C.), or some other suitable maximum threshold value, as will be appreciated in light of this disclosure. In some embodiments, the second gate metal material 154 may have a relatively lower electrical resistivity than that of the first gate metal material 152, such that the difference between the electrical resistivity of the first gate metal material 152 and the second gate metal material 154 is at least 2, 5, 10, 15, 20, 25, 30, 35, 40, 50, 60, 70, 80, 90, or 100 nΩ·m (at 20° C.), or some other suitable threshold difference, as will be appreciated in light of this disclosure. In some embodiments, the second gate metal material 154 may have a relatively lower electrical resistivity than that of the first gate metal material 152, such that the ratio of the electrical resistivity of the first gate metal material 152 to the electrical resistivity of the second gate metal material 154 is at least 1.25, 1.5, 1.75, 2, 2.5, 3, 3.5, 4, 4.5, or 5, or some other suitable threshold ratio, as will be appreciated in light of this disclosure. As can be understood based on this disclosure, the materials in a transistor gate stack structure may be determined using composition mapping, for example, and then after those materials are known, the electrical resistivity properties of those materials can be looked up (as such properties are known quantities) from any suitable source. As previously described, a relatively lower second gate metal material may be used to reduce resistance inside a transistor gate trench, for example. In some embodiments, it may be beneficial that the first gate metal material 152 is located on gate dielectric material 140 and closer to the transistor channel region 112 than the second gate metal material, as first gate metal material 152 may have better properties for controlling the flow of carriers through channel region 112 compared to the second gate metal material, for example. In some embodiments, it may be beneficial that the second gate metal material 154 is located above the first gate metal material 152, as the second gate metal material 154 may have a lower electrical resistivity than the first gate metal material 152, thereby making it a better candidate for making contact with a gate contact metal or an interconnect that is electrically connected to the gate stack (as material 154 would provide relatively less resistance than material 152), for example.

For illustrative purposes only, the table below provides multiple different example combinations for first gate metal material 152 and second gate metal material 154, along with corresponding electrical resistivity values for each material in nΩ·m (at 20° C.). Note that the electrical resistivity values provided in the table below may be slightly different than electrical resistivity values found elsewhere (e.g., plus or minus 5 nΩ·m at 20° C.), as different material property sources may provide different values.

| # | First Gate Metal Material | Electrical Resistivity (nΩ · m at 20° C.) | Second Gate Metal Material | Electrical Resistivity (nΩ · m at 20° C.) |
|---|---|---|---|---|
| 1 | Titanium (Ti) | 420 | Cobalt (Co) | 62.4 |
| 2 | Tungsten (W) | 52.8 | Copper (Cu) | 16.8 |
| 3 | Tantalum (Ta) | 131 | Gold (Au) | 22.1 |
| 4 | Aluminum (Al) | 28.2 | Silver (Ag) | 15.9 |
| 5 | Nickel (Ni) | 69.3 | Aluminum (Al) | 28.2 |
| 6 | Platinum (Pt) | 105 | Tungsten (W) | 52.8 |
| 7 | Titanium (Ti) | 420 | Tungsten (W) | 52.8 |
| 8 | Tungsten (W) | 52.8 | Silver (Ag) | 15.9 |
| 9 | Tantalum (Ta) | 131 | Cobalt (Co) | 62.4 |
| 10 | Aluminum (Al) | 28.2 | Copper (Cu) | 16.8 |
| 11 | Nickel (Ni) | 69.3 | Gold (Au) | 22.1 |
| 12 | Platinum (Pt) | 105 | Aluminum (Al) | 28.2 |

As can be understood based on this disclosure, the etch performed to remove portions of first gate metal 152 from the gate trench region 122 (such as the first gate metal material 152 on the sidewalls of the gate trench region, as can be seen by comparing FIGS. 1D and 1E) results in an increased area in the gate trench region 122 for the second gate metal material 154 to then occupy, in accordance with some embodiments. As can also be understood based on this disclosure, in some such embodiments, because the second gate metal material 154 has lower electrical resistivity properties than the first gate metal material 152, the total resistance in the gate trench region 122 is decreased as a result of an increase in the gate trench area 122 being occupied by metal material with relatively lower electrical resistivity properties (specifically, second gate metal material 154). Such benefits can be achieved while maintaining the electrical benefits of having the relatively higher electrical resistivity layer 152 in the gate stack, for example. As can further be understood based on this disclosure, process flows that include forming a multilayer gate electrode but do not employ the etch techniques described herein with reference to FIG. 1E will not receive the resistance lowering benefits that come with the lower electrical resistivity metal occupying more area in the gate trench region. In some embodiments, the techniques described herein may result in the gate trench region 122 (the region between spacers 120) having its area include at least 50, 60, 70, 80, 85, 90, or 95% occupied by second gate metal material 154, or some other suitable minimum threshold percentage as will be apparent in light of this disclosure.

Figure 2A:
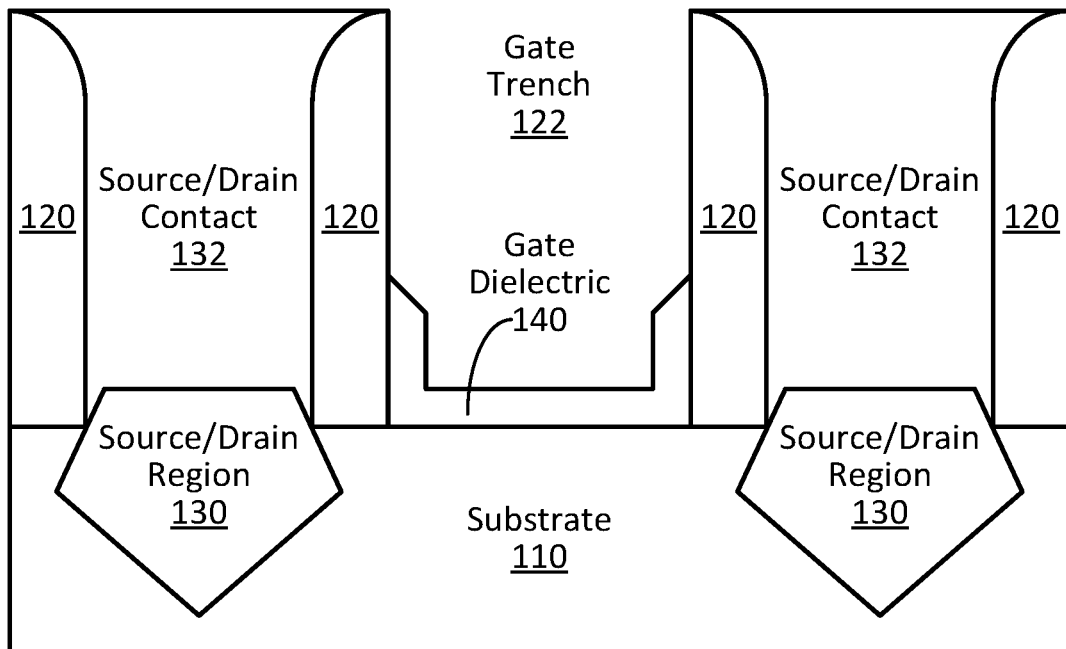
FIGS. 2A-D illustrate example integrated circuit structures resulting from a method configured to form a transistor including gate trench engineering to decrease capacitance, in accordance with some embodiments of this disclosure. Note that the illustrations provided in FIGS. 2A-D are along the orthogonal-to-gate direction, illustrating cross-sectional views that may be achieved, for example, using electron microscopy.
Figure 2B:
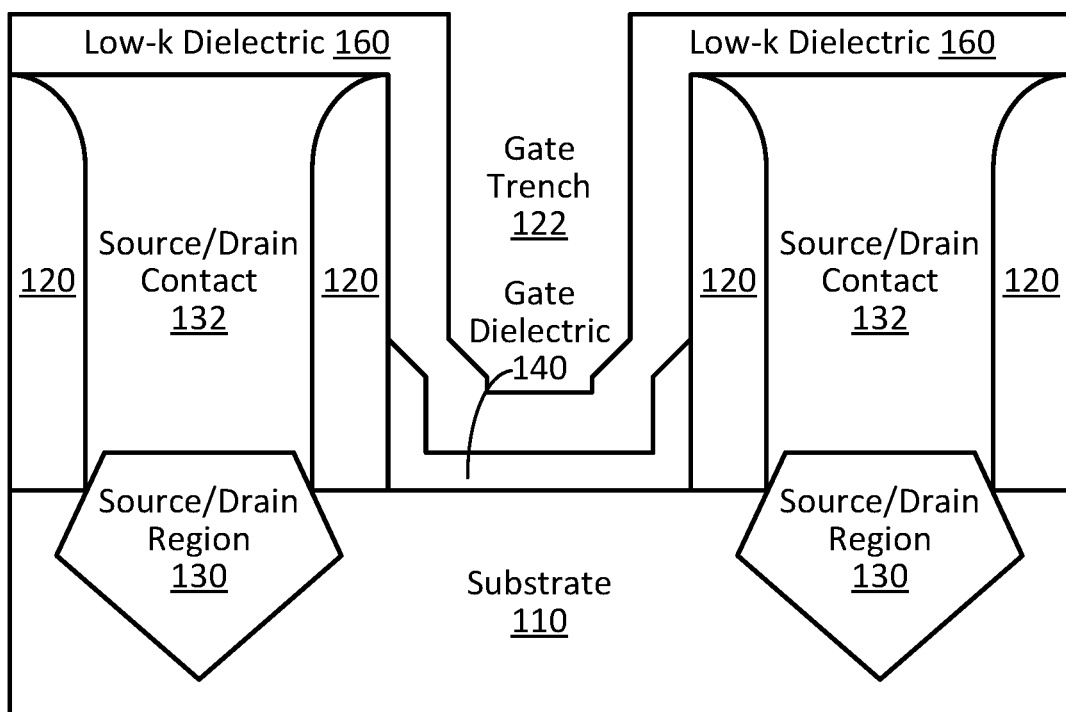
Figure 2C:
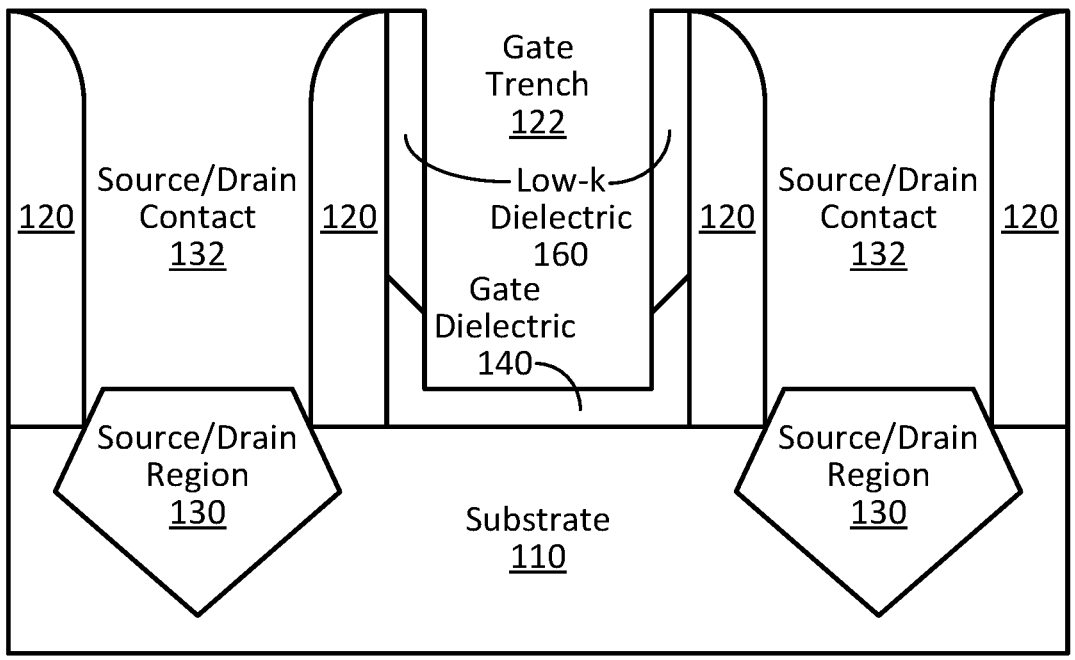

FIGS. 2A-D illustrate example integrated circuit structures resulting from a method configured to form a transistor including gate trench engineering to decrease capacitance, in accordance with some embodiments of this disclosure. FIG. 2A illustrates the same structure as shown in FIG. 1C and described herein, in accordance with an embodiment. Accordingly, all previous relevant disclosure is equally applicable to the structure of FIG. 2A. FIG. 2B illustrates an example structure after low-k dielectric material 160 has been deposited on the structure of FIG. 2A, in accordance with an embodiment. In some embodiments, low-k dielectric material 160 may be formed using any suitable techniques, such as using any suitable deposition process (e.g., CVD, ALD, PVD, or spin-on processing). As can be seen, the low-k dielectric material 160 is formed on the exposed portions of the sidewalls of gate trench 122 in the structure of FIG. 2A. FIG. 2C illustrates an example structure after some of the low-k dielectric material 160 of the structure of FIG. 2B has been removed, in accordance with an embodiment. In some embodiments, any suitable wet and/or dry etch techniques may be used to partially remove the first gate metal material 160 as shown in the resulting structure of FIG. 2C. For example, in some such embodiments, one or more suitable directional etch process may be used to form the low-k dielectric 160 structure shown, where the remaining portions of low-k dielectric material 160 are on spacer material 120 at the gate trench 122 sidewall locations and above gate dielectric material 140. In embodiments where a directional etch process is used, the process may include an anisotropic wet etch technique including a suitable etchant. In some such embodiments, the etchant may selectively remove low-k dielectric material 160 at a rate of at least 2, 3, 4, 5, 10, 15, 20, 25, or 50 times faster, or some other suitable minimum threshold amount, than exposed material on the integrated circuit structure located elsewhere, for example.

In some embodiments, low-k dielectric material 160 may be any suitable material having a dielectric constant k less than that of silicon dioxide. In other words, as silicon dioxide has a dielectric constant k of approximately 3.9, low-k dielectric materials are dielectric materials having a dielectric constant k value of less than 3.9. Example suitable low-k dielectric materials may include carbon-doped oxides (e.g., carbon-doped silicon dioxide), fluoride-doped oxides (e.g., fluoride-doped silicon dioxide), hydrogen-doped oxides (e.g., hydrogen-doped silicon dioxide), porous silicon dioxide, porous carbon-doped silicon dioxide, spin-on organic polymeric dielectrics (e.g., polyimide, polynorbornenes, benzocyclobutene, and polytetrafluoroethylene), spin-on silicon based polymeric dielectrics (e.g., hydrogen silsesquioxane and methylsilsesquioxane), vapor-deposited parylene, highly porous oxides (e.g., xerogels and aerogels), and/or any other suitable low-k dielectric material, as will be appreciated in light of this disclosure. In some embodiments, the low-k dielectric material 160 may have a dielectric constant k of less than 3.9, 3.7, 3.5, 3.3, 3.0, 2.5, or 2.0, or some other suitable maximum threshold value, as will be appreciated in light of this disclosure.

Figure 2D:
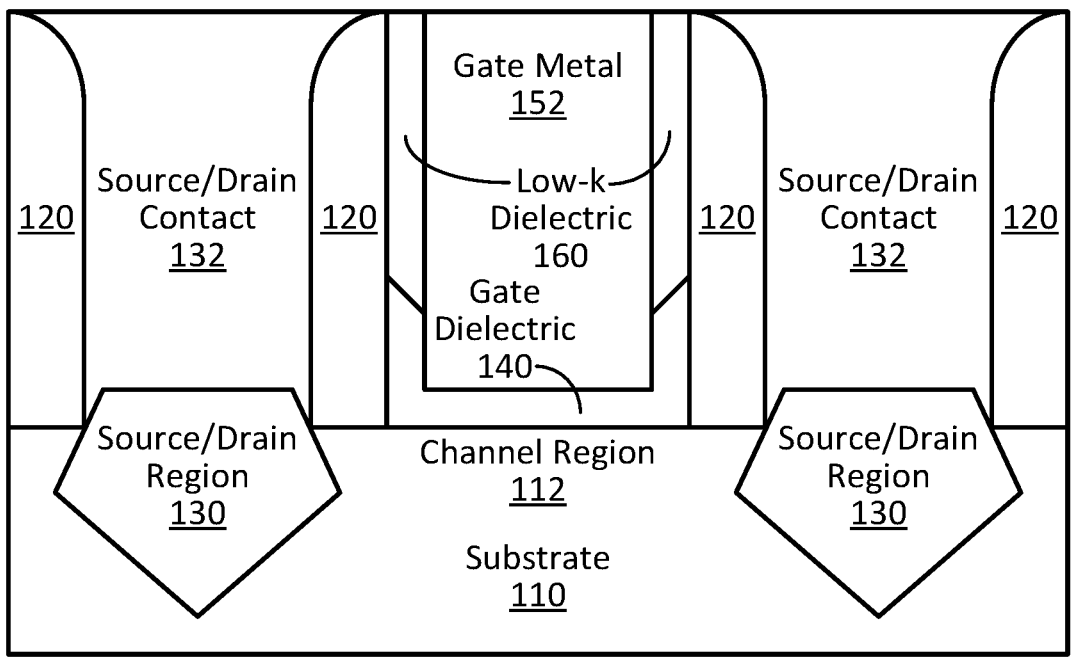

FIG. 2D illustrates an example structure after gate metal 152 has been deposited in the gate trench 122 of the structure of FIG. 2C, in accordance with an embodiment. In some embodiments, gate metal 152 may be formed using any suitable techniques, such as using any suitable deposition process (e.g., CVD, ALD, or PVD). In some embodiments, the deposition of gate metal 152 may have been followed by a planarization and/or polish process to form the example structure shown n FIG. 2D. The previous relevant disclosure with respect to first gate metal material 152 is equally applicable to gate metal material 152 in the structure of FIG. 2D. In other words, in some embodiments, gate metal material 152 may include any suitable metal and/or metal alloy material, such as a titanium (Ti), aluminum (Al), nickel (Ni), and/or platinum (Pt) based compound, to name some examples. Other example materials for first gate metal material 152 may include tungsten (W), tantalum (Ta), titanium nitride (TiN), or tantalum nitride (TaN), just to name some examples. Note that because the gate stack of FIG. 2D only includes one gate metal material (material 152), it does not benefit from the decrease in gate trench resistance described herein with respect to having a second metal gate material that has a relatively lower electrical resistivity than the first gate metal material in the gate stack. As shown in the structure of FIG. 2D, the low-k dielectric material 140 is between gate metal 152 and spacers 120 and can help reduce parasitic capacitance from the gate trench location, for example. As can be understood based on this disclosure, the low-k dielectric material 160 results in a structure with decreased parasitic capacitance compared to similar structures where the low-k dielectric material 160 is replaced by either high-k dielectric material (e.g., material 140) or gate metal material (e.g., gate metal material 152 or 154). Numerous variations on gate trench configurations including low-k dielectric material 140 will be described with reference to FIG. 4.

Figure 3A:
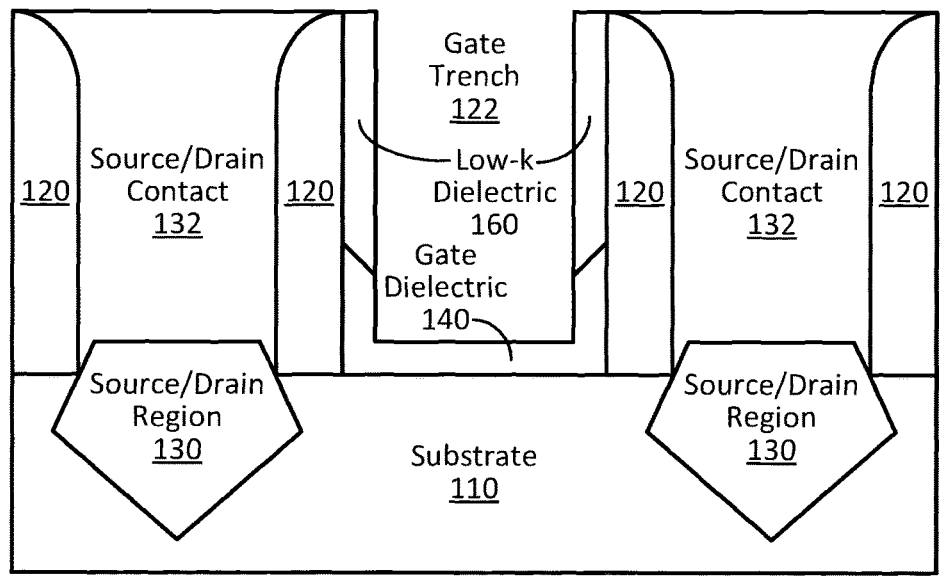
FIGS. 3A-D illustrate example integrated circuit structures resulting from a method configured to form a transistor including gate trench engineering to decrease resistance and capacitance, in accordance with some embodiments of this disclosure. Note that the illustrations provided in FIGS. 3A-D are along the orthogonal-to-gate direction, illustrating cross-sectional views that may be achieved, for example, using electron microscopy.
Figure 3B:
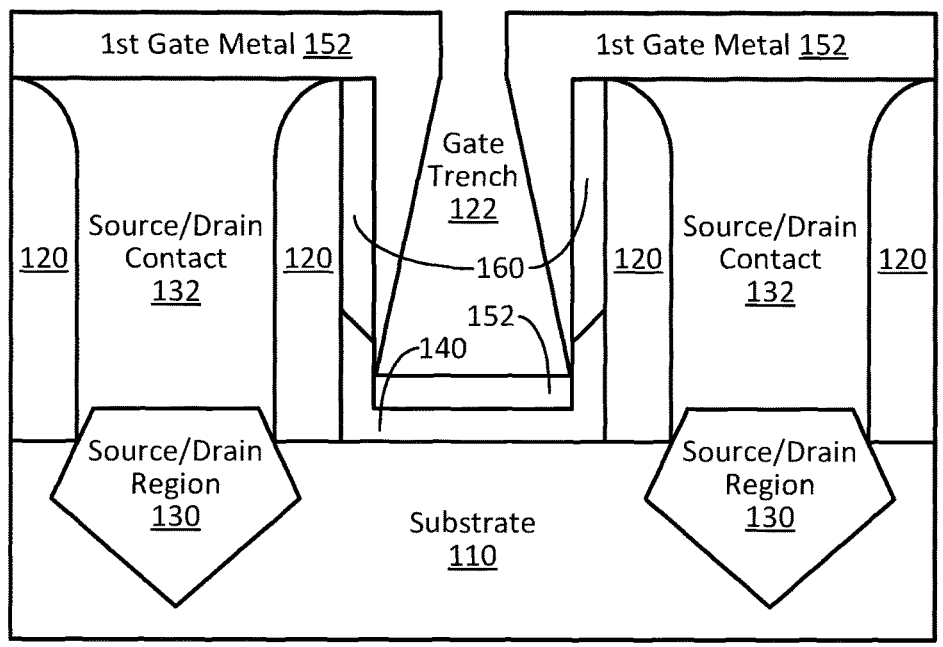
Figure 3C:
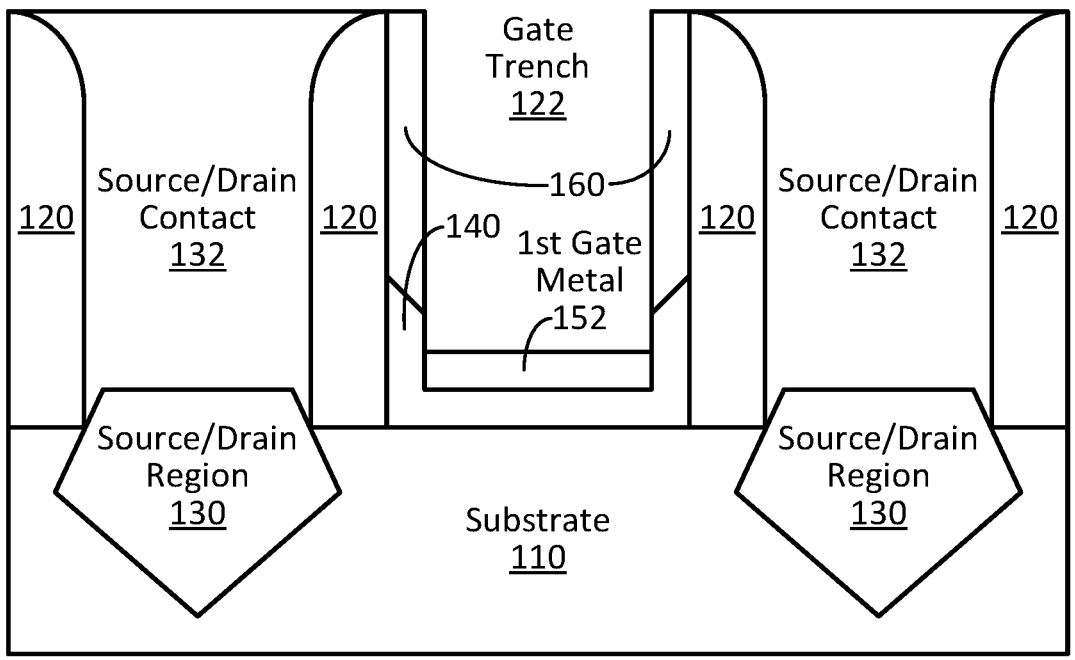
Figure 3D:
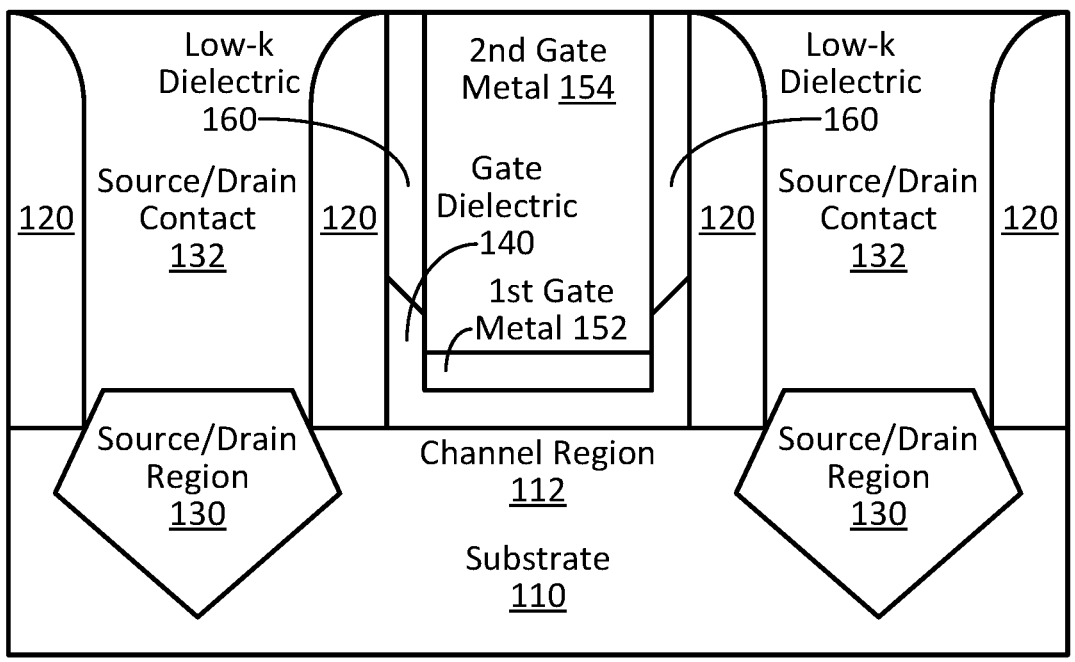

FIGS. 3A-D illustrate example integrated circuit structures resulting from a method configured to form a transistor including gate trench engineering to decrease resistance and capacitance, in accordance with some embodiments of this disclosure. As will be apparent in light of this disclosure, the techniques shown and described with reference to FIGS. 3A-D combine the resistance reducing techniques shown and described with reference to FIGS. 1A-F with the capacitance reducing techniques shown and described with reference to FIGS. 2A-D, in accordance with some embodiments. Therefore, the previous relevant disclosure with respect to FIGS. 1A-F and 2A-D is equally applicable to the example structures of FIGS. 3A-D. FIG. 3A illustrates the same structure shown in FIG. 2C and described herein, in accordance with an embodiment. FIG. 3B illustrates an example structure after first gat metal material 152 has been deposited on the structure of FIG. 3A, in accordance with an embodiment. FIG. 3C illustrates an example structure after some of the first gate metal material 152 of the structure of FIG. 3B has been removed, in accordance with an embodiment. FIG. 3D illustrates an example structure after second gate metal material 154 has been formed in the remainder of gate trench 122 of the structure of FIG. 3C, in accordance with an embodiment. As shown in FIG. 3D, the gate trench location in the example structure includes both the second gate metal material 154 (which may have a lower electrical resistivity than first gate metal material 152 and thereby provide decreased resistance) and the low-k dielectric material 160 on the gate trench sidewalls (which may provide decreased parasitic capacitance compared to a structure including high-k dielectric material or gate material at that location instead). Additional processing may be performed to complete the formation of one or more transistor devices, such as performing back-end-of line interconnections, for example.

Figure 4:
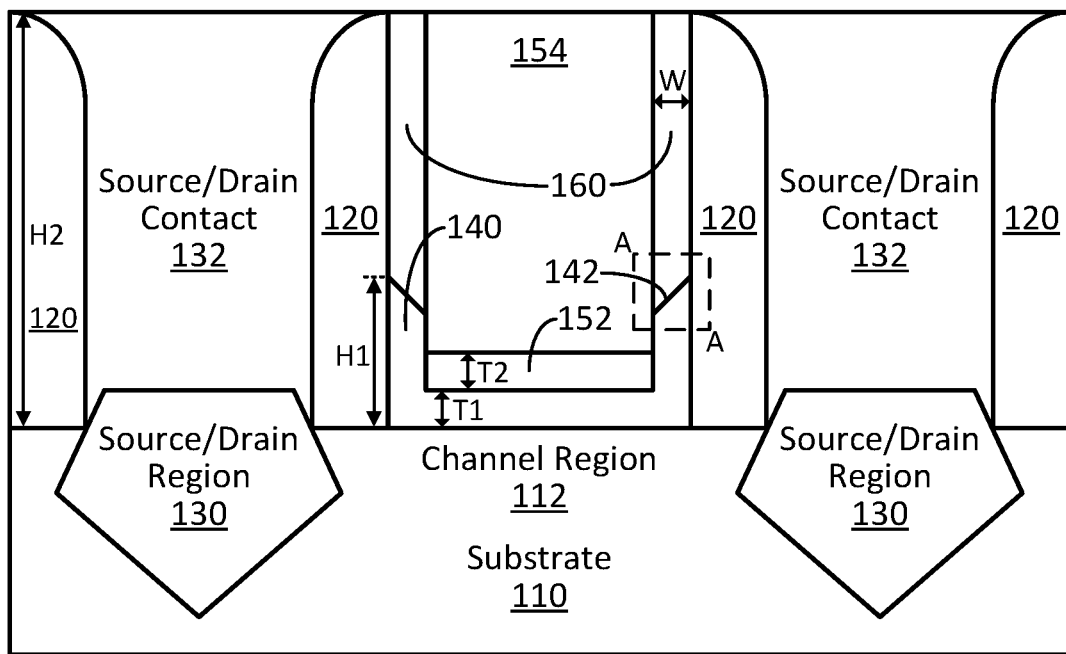
FIG. 4 illustrates the example integrated circuit structure of FIG. 3D including multiple dimension identifiers, in accordance with some embodiments of the present disclosure.

FIG. 4 illustrates the example integrated circuit structure of FIG. 3D including multiple dimension identifiers, in accordance with some embodiments. FIG. 4 is provided to help describe different dimensions of the features of the structure of FIG. 3D. For instance, in this example embodiment, the thickness T1 of gate dielectric layer 140 is shown and is the dimension between the metal gate material (first metal gate material 152, in this example case) and the channel region 112. In some embodiments, gate dielectric layer 140 thickness T1 may be between 0.1 and 100 nm (e.g., 0.5 to 5 nm), or some other suitable value, depending on the end use or target application. Further, in this example embodiment, the thickness T2 of first metal gate material layer 152 is shown and is the dimension between the second metal gate material 154 and gate dielectric layer 140. In some embodiments, first metal gate material layer 152 thickness T2 may be between 0.1 and 100 nm (e.g., 0.2 to 5 nm), or some other suitable value, depending on the end use or target application. Further yet, in this example embodiment, the width W of low-k dielectric material 160 is shown and is the dimension between each spacer and the metal gate material (second metal gate material 154, in this example case). In some embodiments, low-k dielectric 160 width W may be between 0.1 and 100 nm (e.g., 0.5 to 5 nm), or some other suitable value, depending on the end use or target application. Note that width W is also the same dimension of the gate dielectric material 140 between each spacer 120 and the gate metal material 152 or 154. Also note that in this example embodiment, for gate dielectric material 140, the thickness T1 is the same as width W; however, the present disclosure is not intended to be so limited.

Further still, in this example embodiment, the maximum height H1 of the gate dielectric layer material 140 is shown and is the height or vertical dimension of the sides of the material that are adjacent to each spacer 120, as can be seen. In other words, the height of gate dielectric layer material 140 extends up each spacer 120 a height H1. As can also be seen, the height of spacers 120 is indicated as height H2. In some embodiments, height H1 may be equal to thickness T1, such that gate dielectric layer material 140 has a sufficiently consistent height or thickness T1. In some embodiments, it may be beneficial for height H1 to be greater than thickness T1, such that the gate dielectric material 140 is not recessed too much during the etch performed to form the material in the gate trench. For instance, if the gate dielectric material 140 is recessed too far, than it may be too thin to properly function as a gate dielectric layer and/or portions of the material 140 may be broken through to the material of channel region 112. In some embodiments, the height H1 that gate dielectric material 140 extends up spacers 120 may be expressed in a ratio with the total height H2 of each spacer 120, and such a ratio of the total height of each spacer H2 to the height H1 may be at least (H2:H1) 1, 1.25, 1.5, 1.75, 2, 2.25, 2.5, 2.75, 3, 4, or 5, or some other suitable ratio threshold, as will be appreciated in light of this disclosure. In some embodiments, gate dielectric material 140 may only extend halfway up each spacer 120 or less, such that H1 is less than or equal to one half H2. In other words, gate dielectric material 140 may only extend to the middle of the gate trench region or lower. As can be understood, where present, low-k dielectric material may extend down from the top of each spacer 120 and along each spacer a height that is H2-H1, as can be seen.

FIGS. 5A-D illustrate example blown out views of the square portion A-A indicated in the example integrated circuit structure of FIG. 4, in accordance with some embodiments. As can be seen in FIGS. 5A-D, everything is the same in each structure, except for the profiles of the interfaces 142, 144, 146, and 148 between gate dielectric material 140 and low-k dielectric material 160. As can be understood based on this disclosure, the shape or profile of the interfaces 142, 144, 146, and 148 may be formed as a result of a the etch process used to form gate dielectric material feature 140, such as the directional etch process used to form the structure of FIG. 1C, for example. Moreover, edge profile 142 indicated in the example structure of FIG. 1C is the same profile of the interface 142 shown in FIGS. 4 and 5A. As shown, FIG. 5A includes the same interface profile 142 as the example structure of FIG. 4. The interface profiles 144, 146, and 148 of FIGS. 5B-D, respectively, illustrate example variations that may occur. Note that although the interface profile 142 is shown as the same on both sides of the metal gate in the example structure of FIG. 4 (e.g., same height H1, size, and shape), in other embodiments, that need not be the case and the present disclosure is not intended to be so limited. Also note that in FIGS. 5A-D, side or edge 141 is indicated and is the side of gate dielectric material 140 closest to adjacent spacer material 120, and side or edge 143 is indicated and is the side of gate dielectric material 140 closest to the metal gate (specifically, second metal gate material 154, in these example cases).

Figure 5A:
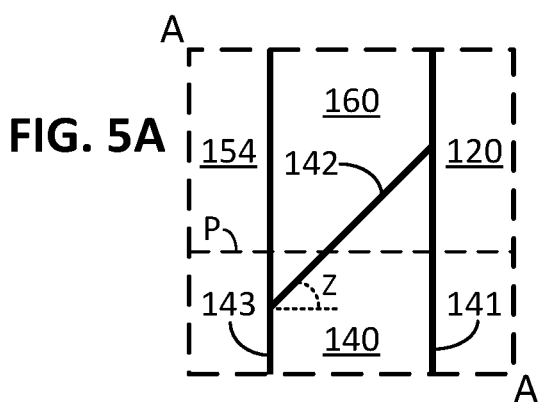
FIGS. 5A-D illustrate example blown out views of the square portion A-A indicated in the example integrated circuit structure of FIG. 4, in accordance with some embodiments of the present disclosure.
Figure 5B:
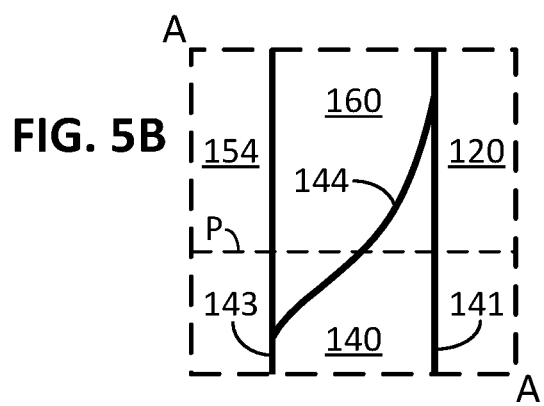
Figure 5C:
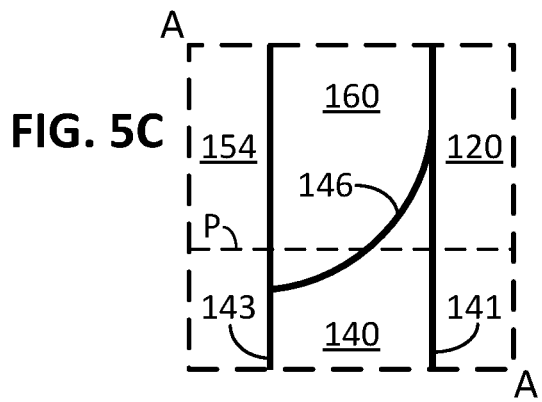
Figure 5D:
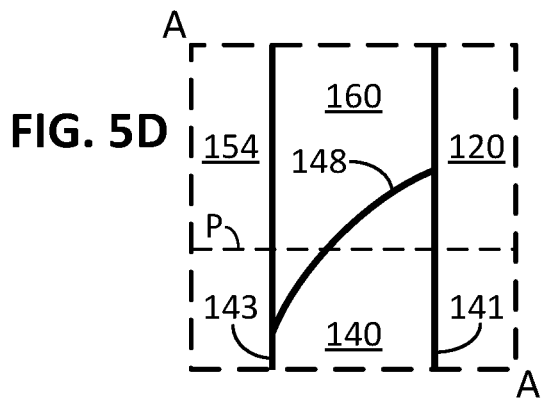

FIG. 5A illustrates that interface profile 142, in this example embodiment, is a straight line and has an angle of inclination of Z. Although angle of inclination Z of interface profile 142 is 45° in this example embodiment, in some embodiments, angle of inclination Z may be between 0 and 80°, as will be appreciated in light of this disclosure. Note that in this example case, angle of inclination Z is measured from a horizontal line going in a direction from gate metal 154 to spacer 120 as shown. In other words, in some embodiments, interface profile 142 may have a downward slope toward the channel region 112 going from the adjacent spacer 120 to the metal gate (specifically, second metal gate layer 154, in the example structure of FIG. 5A). As previously described, interface profiles 144, 146, and 148 in FIGS. 5B-D, respectively, illustrate variations that may occur to the interface profile between gate dielectric material 140 and low-k dielectric material 160 (where present). Such variations include more curved interface profiles compared to interface profile 142, as shown. In embodiments where low-k dielectric material is not present, interfaces 142, 144, 146, and 148 would be between gate dielectric material 140 and the metal gate material, such as is shown in FIG. 1F. In all of the example structures shown in FIGS. 5A-D, spacer material 120, gate dielectric material 140, low-k dielectric material 160, and metal gate material (material 154, in these example cases) all share at least one common horizontal plane, which is indicated as dashed line P. In other words, in such embodiments, there is a material overlap between gate dielectric material 140 and low-k dielectric material 160 between each spacer 120 and the metal gate. As can be understood based on this disclosure, in some embodiments, the four material features share at least one common horizontal plane as a result of the directional etch performed to form the example structure of FIG. 1C (where example variations 144, 146, and 148 may occur to profile 142).

Figure 6:
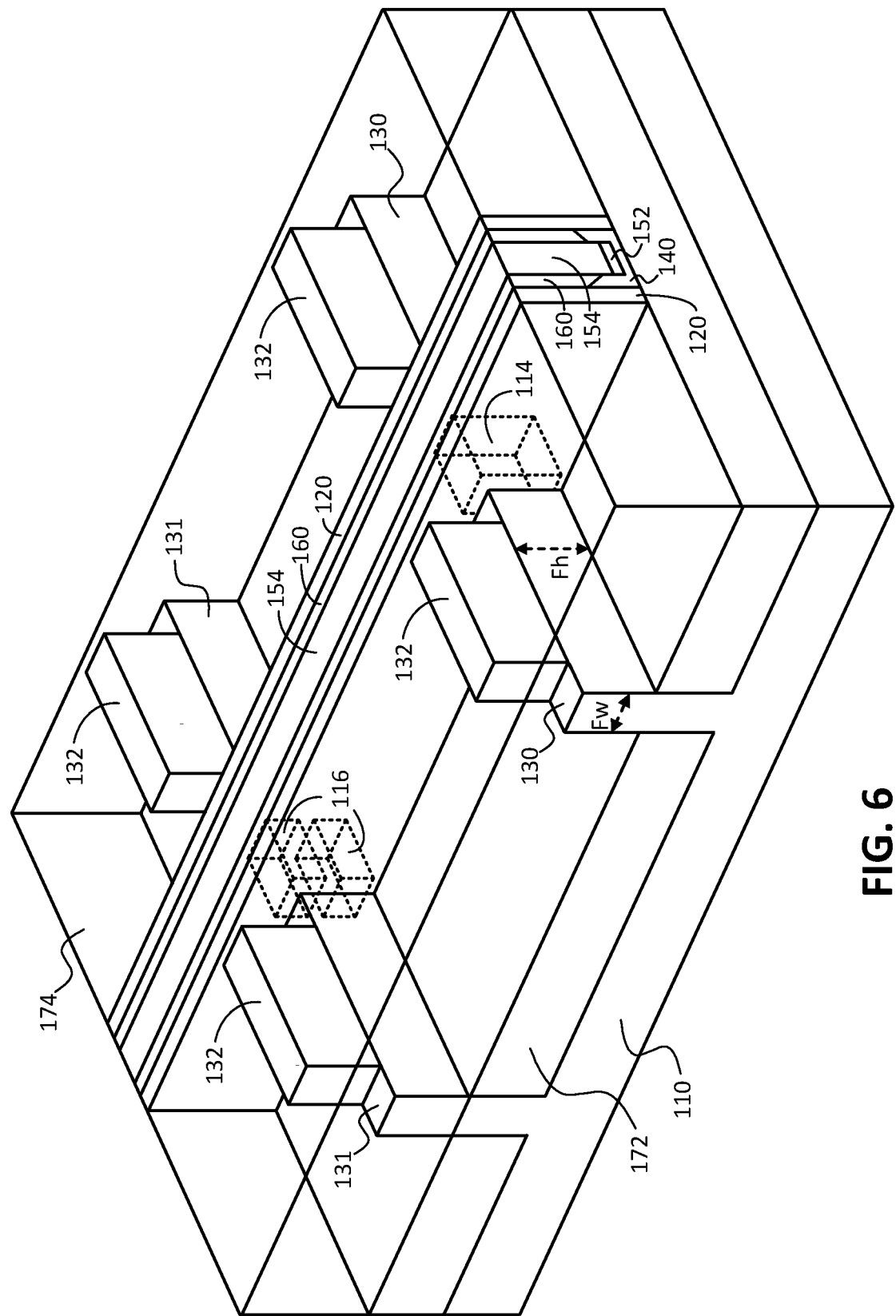
FIG. 6 illustrates example non-planar transistor architectures including gate trench engineering to decrease resistance and capacitance, in accordance with some embodiments of this disclosure.

FIG. 6 illustrates example non-planar transistor architectures including gate trench engineering to decrease resistance and capacitance, in accordance with some embodiments of this disclosure. The previous relevant disclosure with reference to features already described herein (e.g., substrate 110, spacers 120, source/drain 130, gate dielectric 140, and so forth) is equally applicable to the integrated circuit structure of FIG. 6. However, as can be seen in the example embodiment of FIG. 6, the transistor structure includes a finned channel region 114 and a nanowire channel region 116 to illustrate two example non-planar transistor configurations with which the techniques described herein can be used. Note that the structure in this example embodiment also includes finned source/drain regions 130 and 131, where source/drain regions 130 include material native to the material of substrate 110 and source/drain regions 131 include replacement material. Also note that shallow trench isolation (STI) regions 172 are shown between the set of fins in this example embodiment and may be present to assist with electrical isolation of the fins, for example. Further note that inter-layer dielectric (ILD) material 174 is shown formed over portions of the structure, in this example embodiment, which may be used to help electrically isolate and/or protect various features of the transistors, for example. In some embodiments, the STI and ILD materials may formed using any suitable techniques and may include any suitable materials, such as insulator, dielectric, oxide, and/or nitride material, depending on the end use or target application. As shown, the example structure includes two fins, which may have been formed using any suitable techniques, such as patterning and etching substrate 110 to form the desired number of fins, and optionally etching and removing the fins to replace them with fins of different material (e.g., which may have been performed to form the replacement fins used for source/drain regions 131). In some embodiments, the source/drain region of the fins may be removed and replaced with epitaxial source/drain material. Whether or not the source/drain regions 130 and 131 were replaced, in some embodiments, the regions may include any suitable doping scheme, depending on the end use or target application.

As can be understood based on this disclosure, the gate trench region in the example structure of FIG. 6 includes the configuration shown in FIG. 3D (including gate dielectric 140, low-k dielectric 160, first gate metal 152, and second gate metal 154, in this example embodiment). In some embodiments, the gate trench region may not include low-k dielectric layer 160 between the spacers and gate material (e.g., as was the case in the example embodiment shown in FIG. 1F). In some embodiments, the gate trench region may not include second gate metal 154 (e.g., as was the case in the example embodiment shown in FIG. 2D). In this example embodiment, on the right fin, the gate stack is formed on three portions of the finned channel region 114 to create a finned or finFET transistor configuration. Such a finned configuration is sometimes referred to as a tri-gate or three-dimensional (3D) configuration, as the conductive channel of such finned configurations essentially resides along three different outer substantially planar regions of the fin (and thus there are three effective gates). In some embodiments, other types of non-planar transistor configurations can be achieved using the techniques described herein, such as dual-gate configurations, in which the conductive channel, for example, principally resides only along the two sidewalls of the fin (and not along the top of the fin). Another non-planar transistor configuration is a gate-all-around (GAA) configuration, which is configured similarly to a fin-based configuration, but instead of a finned channel region where the gate is on three portions, one or more nanowires (or nanoribbons) are used and the gate material generally surrounds each nanowire, such as the two nanowires 116 illustrated in FIG. 6. Such nanowire configurations may be achieved, in some embodiments, by including sacrificial material in the channel region of the fin and etching out the sacrificial material prior to forming the gate stack when the channel region is exposed (e.g., during a replacement gate or replacement metal gate (RMG) process). In some embodiments, non-planar configurations may be used to provide various benefits, such as increasing carrier mobility or increasing the effective control of the charge in the channel regions, for example.

As can be seen in the example embodiment of FIG. 6, the width Fw and height Fh of the two fins are shown as the same for ease of illustration. In some embodiments, the fins may be formed to have widths Fw in the range of 3 to 100 nm, for example, or any other suitable width depending on the end use or target application. In some embodiments, the fins may be formed to have heights Fh in the range of 5 to 100 nm, or any other suitable height depending on the end use or target application. In some embodiments, the fins may be formed with a desired approximate height Fh to width Fw ratio (Fh:Fw), such as approximately 1.5:1, 2:1, 3:1, 4:1, 5:1, or any other suitable Fh:Fw ratio, depending on the end use or target application. In some such embodiments, an aspect ratio trapping (ART) scheme may have been used to form fins having a height to width (Fh:Fw) ratio of at least 4:1, for example. Note that although two fins in the example structure of FIG. 6 are illustrated as having the same widths Fw and heights Fh, the present disclosure is not intended to be so limited. For example, in some embodiments, fins formed on the same substrate or die may be formed to have varying widths and/or heights, depending on the end use or target application. Also note that although two fins are illustrated in the example structure of FIG. 4, any number of fins may be formed during the integrated circuit fabrication process, such as 1, 3, 5, 10, 100, thousands, millions, or more, depending on the end use or target application. Numerous variations and configurations will be apparent in light of this disclosure.

Example System

Figure 7:
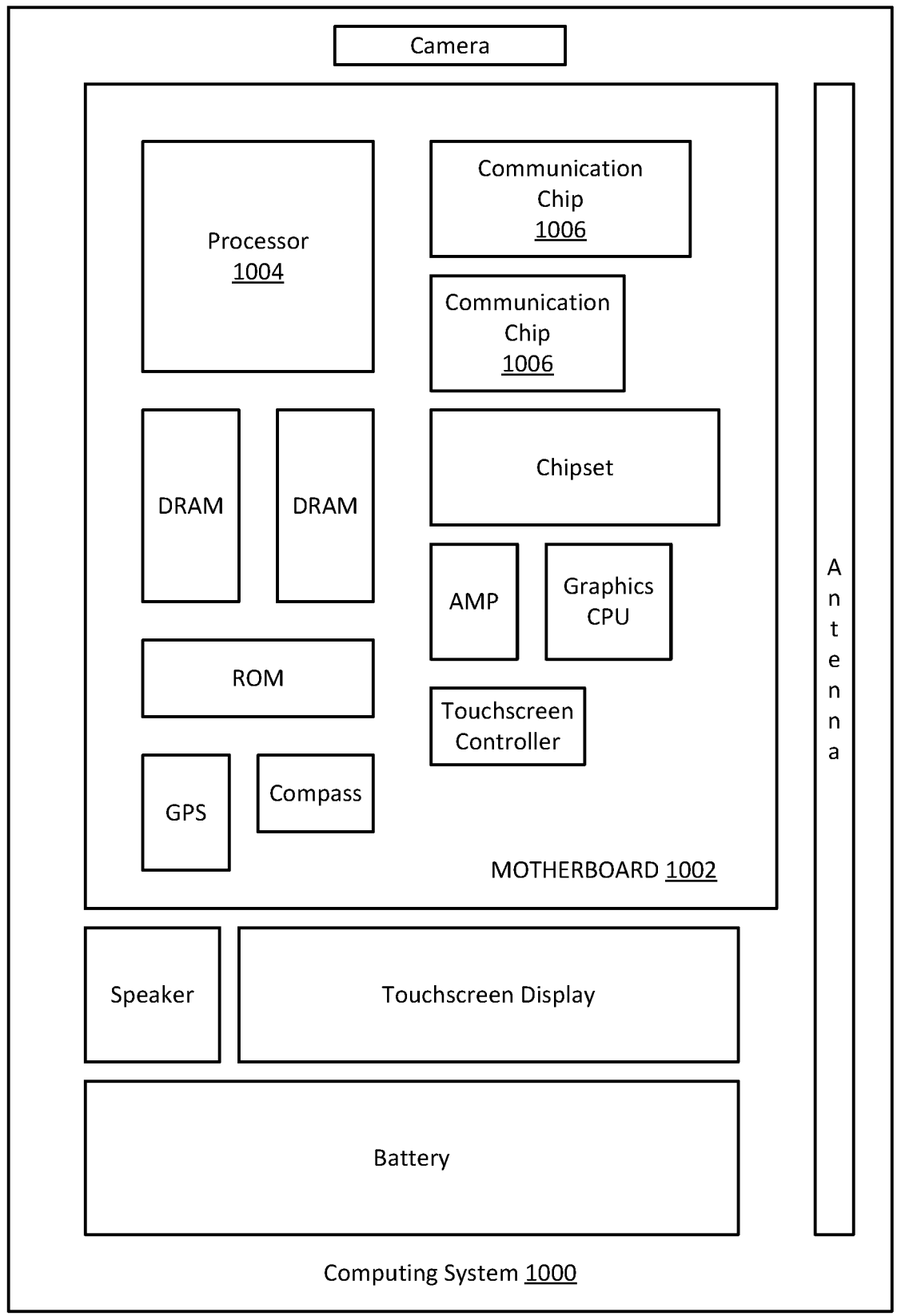
FIG. 7 illustrates a computing system implemented with integrated circuit structures or devices formed using the techniques disclosed herein, in accordance with some embodiments.

FIG. 7 illustrates a computing system 1000 implemented with integrated circuit structures or devices formed using the techniques disclosed herein, in accordance with some embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is a transistor including: a gate stack including a gate dielectric and a metal gate, the gate dielectric including high-k dielectric material, the metal gate including a first metal layer having a first electrical resistivity and a second metal layer having a second electrical resistivity less than the first electrical resistivity, wherein the second metal layer is above the first metal layer; spacers adjacent to both sides of the gate stack, wherein the first metal layer is not between the second metal layer and either of the spacers; a channel region below the gate stack, wherein the gate dielectric is between the channel region and the metal gate; and source and drain (S/D) regions adjacent to the channel region.

Example 2 includes the subject matter of Example 1, wherein the high-k dielectric material is also between the metal gate and at least one of the spacers, and wherein a side of the high-k dielectric material closest to the at least one spacer extends higher than a side of the high-k dielectric material closest to the metal gate.

Example 3 includes the subject matter of Example 2, wherein the side of the high-k dielectric material closest to the spacer extends no more than halfway up the at least one spacer.

Example 4 includes the subject matter of any of Examples 1-3, wherein the channel region includes at least one of a group IV semiconductor material and a group III-V semiconductor material.

Example 5 includes the subject matter of any of Examples 1-4, further including low-k dielectric material between at least one of the spacers and the metal gate.

Example 6 includes the subject matter of Example 5, wherein the at least one spacer, high-k dielectric material, low-k dielectric material, and metal gate all share at least one common horizontal plane.

Example 7 includes the subject matter of any of Examples 5-6, wherein an interface between the low-k dielectric material and the high-k dielectric material has a downward slope toward the channel region going from the at least one spacer to the metal gate.

Example 8 includes the subject matter of any of Examples 1-7, wherein the first metal layer includes at least one of titanium (Ti), aluminum (Al), nickel (Ni), platinum (Pt), tungsten (W), and tantalum (Ta).

Example 9 includes the subject matter of any of Examples 1-8, wherein the second metal layer includes at least one of cobalt (Co), copper (Cu), gold (Au), silver (Ag), aluminum (Al), and tungsten (W).

Example 10 includes the subject matter of any of Examples 1-9, wherein the second electrical resistivity is at least 10 nΩ·m at 20° C. less than the first electrical resistivity.

Example 11 includes the subject matter of any of Examples 1-10, wherein the first metal layer has a thickness between the gate dielectric and the second metal layer of 0.5 to 5 nm.

Example 12 includes the subject matter of any of Examples 1-11, wherein the gate dielectric has a thickness between the first metal layer and the channel region of 0.5 to 5 nm.

Example 13 includes the subject matter of any of Examples 1-12, wherein the transistor is one of a p-type and an n-type transistor.

Example 14 includes the subject matter of any of Examples 1-13, wherein the transistor has a planar configuration.

Example 15 includes the subject matter of any of Examples 1-13, wherein the transistor has a non-planar configuration.

Example 16 includes the subject matter of any of Examples 1-15, wherein the transistor is one of a metal-oxide-semiconductor FET (MOSFET) and a tunnel FET (TFET).

Example 17 is a computing system including the subject matter of any of Examples 1-16.

Example 18 is a transistor including: a gate stack including a gate dielectric and a metal gate, the gate dielectric including high-k dielectric material; spacers adjacent to both sides of the gate stack; a channel region below the gate stack, wherein the gate dielectric is between the channel region and the metal gate; source and drain (S/D) regions adjacent to the channel region; and low-k dielectric material between the spacers and the metal gate, wherein the spacers, gate dielectric, low-k dielectric material, and metal gate all share at least one common horizontal plane.

Example 19 includes subject matter of Example 18, wherein the high-k dielectric material is also between the metal gate and at least one of the spacers, and wherein a side of the high-k dielectric material closest to the spacer extends higher than a side of the high-k dielectric material closest to the metal gate.

Example 20 includes subject matter of Example 19, wherein the side of the high-k dielectric material closest to the spacer extends no more than halfway up the at least one spacer.

Example 21 includes subject matter of any of Examples 18-20, wherein the channel region includes at least one of a group IV semiconductor material and a group III-V semiconductor material.

Example 22 includes subject matter of any of Examples 18-21, the metal gate including a first metal layer having a first electrical resistivity and a second metal layer having a second electrical resistivity less than the first electrical resistivity, wherein the second metal layer is above the first metal layer, and wherein the first metal layer is not between the second metal layer and either of the spacers.

Example 23 includes subject matter of Example 22, wherein the second electrical resistivity is at least 10 nΩ·m at 20° C. less than the first electrical resistivity.

Example 24 includes subject matter of any of Examples 22-23, wherein the first metal layer has a thickness between the gate dielectric and the second metal layer of 0.5 to 5 nm.

Example 25 includes subject matter of any of Examples 22-24, wherein the first metal layer includes at least one of titanium (Ti), aluminum (Al), nickel (Ni), platinum (Pt), tungsten (W), and tantalum (Ta).

Example 26 includes subject matter of any of Examples 22-25, wherein the second metal layer includes at least one of cobalt (Co), copper (Cu), gold (Au), silver (Ag), aluminum (Al), and tungsten (W).

Example 27 includes subject matter of any of Examples 18-26, wherein an interface between the low-k dielectric material and the high-k dielectric material has a downward slope toward the channel region going from the at least one spacer to the metal gate.

Example 28 includes subject matter of Example 27, wherein the downward slope is at least 45 degrees from horizontal.

Example 29 includes subject matter of any of Examples 18-28, wherein the gate dielectric has a thickness between the first metal layer and the channel region of 0.5 to 5 nm.

Example 30 includes the subject matter of any of Examples 18-29, wherein the transistor is one of a p-type and an n-type transistor.

Example 31 includes the subject matter of any of Examples 18-30, wherein the transistor has a planar configuration.

Example 32 includes the subject matter of any of Examples 18-30, wherein the transistor has a non-planar configuration.

Example 33 includes the subject matter of any of Examples 18-32, wherein the transistor is one of a metal-oxide-semiconductor FET (MOSFET) and a tunnel FET (TFET).

Example 34 is a computing system including the subject matter of any of Examples 18-33.

Example 35 is a method of forming a transistor, the method including: forming a dummy gate stack above a substrate; forming spacers adjacent to both sides of the dummy gate stack; removing the dummy gate stack to form a gate trench region between the spacers; forming a layer of high-k dielectric material in the gate trench region; forming a layer of first gate metal material in the gate trench region, the first gate metal material having a first electrical resistivity; removing the first gate metal material from sidewalls of the gate trench region; and forming a layer of second gate metal material in the gate trench region; the second gate metal material having a second electrical resistivity less than the first electrical resistivity.

Example 36 includes the subject matter of Example 35, wherein forming the layer of high-k dielectric material in the gate trench region includes depositing the high-k dielectric material in the gate trench region and performing a directional etch process to partially remove the high-k dielectric material to expose sidewalls of the gate trench.

Example 37 includes the subject matter of any of Examples 35-36, wherein the gate trench region includes a bottom and sidewalls, and wherein the layer of high-k dielectric material is formed on the bottom and sidewalls of the gate trench region.

Example 38 includes the subject matter of any of Examples 35-37, wherein removing the first gate metal material from sidewalls of the gate trench region includes performing a directional etch process.

Example 39 includes the subject matter of any of Examples 35-38, wherein the second electrical resistivity is at least 10 nΩ·m at 20° C. less than the first electrical resistivity.

Example 40 includes the subject matter of any of Examples 35-39, further including forming a layer of low-k dielectric material in the gate trench region.

Example 41 includes the subject matter of Example 40, wherein the layer of low-k dielectric material is formed in the gate trench region after forming the gate dielectric material and before forming the first gate metal material.

Example 42 includes the subject matter of any of Examples 40-41, wherein the layer of low-k dielectric material is formed on sidewalls of the gate trench region and on the spacers.

Example 43 includes the subject matter of any of Examples 35-42, wherein the substrate includes at least one of a group IV semiconductor material and a group III-V semiconductor material.

Example 44 includes the subject matter of any of Examples 35-43, wherein the first gate metal material includes at least one of titanium (Ti), aluminum (Al), nickel (Ni), platinum (Pt), tungsten (W), and tantalum (Ta).

Example 45 includes the subject matter of any of Examples 35-44, wherein the second gate metal material includes at least one of cobalt (Co), copper (Cu), gold (Au), silver (Ag), aluminum (Al), and tungsten (W).

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
    a gate structure including a gate dielectric and a gate electrode, the gate dielectric including high-k dielectric material, the gate electrode including a first layer including one or more first metals and having a first electrical resistivity, the gate electrode further including a second layer including one or more second metals and having a second electrical resistivity less than the first electrical resistivity, the second layer above the first layer;
    a first spacer and a second spacer, the gate structure between the first and second spacers, the first layer absent between the second layer and the first spacer, the first layer absent between the second layer and the second spacer, and wherein the gate dielectric includes first and second uppermost portions that are laterally between the first and second spacers, each of the first and second uppermost portions including an angled surface that slopes downward toward the gate structure, wherein the first uppermost portion of the gate dielectric is laterally between the gate electrode and the first spacer,
    wherein the entirety of the first uppermost portion is lower than an uppermost surface of the first spacer, wherein the second uppermost portion of the gate dielectric is laterally between the gate electrode and the second spacer, and
    wherein the entirety of the second uppermost portion is lower than an uppermost surface of the second spacer;
    a body at least below the gate structure, the gate dielectric between the body and the gate electrode, the body including semiconductor material; and
    a source region and a drain region, the body at least partially between the source and drain regions, the source and drain regions including semiconductor material.

2. The integrated circuit of claim 1, wherein a ratio of a total height of the first spacer to a height to which the first uppermost portion of the gate dielectric extends is 1.25 or higher, and a ratio of a total height of the second spacer to a height to which the second uppermost portion of the gate dielectric extends is 1.25 or higher.

3. The integrated circuit of claim 2, wherein the first uppermost portion of the gate dielectric is no more than halfway up the first spacer.

4. The integrated circuit of claim 1, wherein the semiconductor material included in the body comprises at least one of a group IV semiconductor material or a group III-V semiconductor material.

5. The integrated circuit of claim 1, further comprising low-k dielectric material between the gate electrode and the first spacer, wherein the first uppermost portion of the gate dielectric is directly underneath at least a section of the low-k dielectric material.

6. The integrated circuit of claim 5, wherein the first spacer, high-k dielectric material, low-k dielectric material, and gate electrode all share at least one common horizontal plane.

7. The integrated circuit of claim 5, wherein a first interface between the low-k dielectric material and the first uppermost portion of the gate dielectric has a downward slope that corresponds to the angled surface of the first uppermost portion, and a second interface between the low-k dielectric material and the second uppermost portion of the gate dielectric has a downward slope that corresponds to the angled surface of the second uppermost portion.

8. The integrated circuit of claim 1, wherein:
    the first layer includes at least one of titanium, aluminum, nickel, platinum, tungsten, or tantalum, and wherein the second layer includes at least one of cobalt, copper, gold, silver, aluminum, or tungsten;
    the second electrical resistivity is at least 10 nΩ·m at 20° C. less than the first electrical resistivity;
    the first layer has a thickness between the gate dielectric and the second layer of 0.5 to 5 nanometers; and
    the gate dielectric has a thickness between the first layer and the body of 0.5 to 5 nanometers.

9. The integrated circuit of claim 1, wherein the semiconductor material included in the source and drain regions includes p-type dopant or n-type dopant.

10. The integrated circuit of claim 1, wherein the body is a fin, the fin between portions of the gate structure.

11. The integrated circuit of claim 1, wherein the gate structure wraps around the body.

12. The integrated circuit of claim 1, wherein the body is configured to be a channel for a transistor, and wherein the transistor is a metal-oxide-semiconductor FET (MOSFET) or a tunnel FET (TFET).

13. A computing system comprising the integrated circuit of claim 1.

14. The integrated circuit of claim 1, further comprising:
low-k dielectric material between the gate electrode and the first spacer, the gate dielectric absent between at least a part of the second layer and the low-k dielectric material.

15. The integrated circuit of claim 1, wherein the gate dielectric is laterally absent between at least a section of the gate electrode and the first spacer, and is laterally absent between at least the section of the gate electrode and the second spacer.

16. An integrated circuit including at least one transistor, the integrated circuit comprising:
- a gate structure including a gate dielectric and a gate electrode, the gate dielectric including high-k dielectric material, the gate electrode including one or more metals;
- a first spacer and a second spacer, the gate structure between the first and second spacers;
- a body at least below the gate structure, the gate dielectric between the body and the gate electrode, the body including semiconductor material;
- a source region and a drain region, the body at least partially between the source and drain regions, the source and drain regions including semiconductor material; and
- low-k dielectric material between the gate electrode and the first spacer, the low-k dielectric material also between the gate electrode and the second spacer, wherein the first spacer, second spacer, gate dielectric, low-k dielectric material, and gate electrode all share at least one common horizontal plane, and wherein at least a part of the gate electrode is in contact with the low-k dielectric material.

17. The integrated circuit of claim 16, wherein the gate electrode includes a first layer having a first electrical resistivity and a second layer having a second electrical resistivity less than the first electrical resistivity, the second layer above the first layer, the first layer in direct contact with the gate dielectric but not in direct contact with the low-k dielectric material, wherein the second electrical resistivity is at least 10 nΩ·m at 20° C. less than the first electrical resistivity.

18. An integrated circuit including at least one transistor, the integrated circuit comprising:
- a gate structure including a gate dielectric and a gate electrode, the gate dielectric including high-k dielectric material, the gate electrode including (i) a first layer including one or more first metals and (ii) a second layer including one or more second metals, the second layer above the first layer;
- a first spacer and a second spacer, the gate structure between the first and second spacers, the first layer absent between the second layer and the first spacer, the first layer absent between the second layer and the second spacer;
- a body at least below the gate structure, the gate dielectric between the body and the gate electrode; and
- a source region and a drain region, the body at least partially between the source and drain regions;
- wherein the gate dielectric has a section between the first spacer and the gate electrode, the section of the gate dielectric having (i) a first surface adjacent to the first spacer, (ii) a second surface opposite the first surface, the second surface adjacent to the gate electrode, and (iii) a third surface between the first and second surfaces, and wherein the third surface is angled in that it slopes downward from the first surface to the second surface, and wherein the section of the gate dielectric between the first spacer and the gate electrode extends no more than halfway up the first spacer.

19. The integrated circuit of claim 18, wherein the first surface of the section of the gate dielectric is directly adjacent to the first spacer, and the second surface of the section of the gate dielectric is directly adjacent to the gate electrode.

20. The integrated circuit of claim 18, further comprising:
low-k dielectric material between the gate electrode and the first spacer, wherein the third surface of the gate dielectric is adjacent to the low-k dielectric material.

* * * * *